United States Patent
Akagawa et al.

(10) Patent No.: US 10,468,462 B2
(45) Date of Patent: Nov. 5, 2019

(54) MANUFACTURING METHOD OF ORGANIC LIGHT EMITTING DEVICE, ORGANIC LIGHT EMITTING DEVICE AND ELECTRONIC APPARATUS

(71) Applicant: SEIKO EPSON CORPORATION, Tokyo (JP)

(72) Inventors: Suguru Akagawa, Matsumoto (JP); Yuki Hanamura, Shiojiri (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 15/586,629

(22) Filed: May 4, 2017

(65) Prior Publication Data
US 2017/0236876 A1    Aug. 17, 2017

Related U.S. Application Data

(62) Division of application No. 14/602,683, filed on Jan. 22, 2015, now abandoned.

(30) Foreign Application Priority Data

Feb. 14, 2014    (JP) .................. 2014-026322

(51) Int. Cl.
*H01L 27/32* (2006.01)
*H01L 51/50* (2006.01)
(Continued)

(52) U.S. Cl.
CPC ............ *H01L 27/322* (2013.01); *G02B 5/201* (2013.01); *H01L 27/3216* (2013.01);
(Continued)

(58) Field of Classification Search
CPC .......... H01L 51/50; H01L 51/52; H01L 27/322
See application file for complete search history.

(56) References Cited

U.S. PATENT DOCUMENTS

| 6,552,488 B1 | 4/2003 | Roitman et al. |
| 7,940,001 B2 | 5/2011 | Park et al. |

(Continued)

FOREIGN PATENT DOCUMENTS

| JP | 2001-126864 A | 5/2001 |
| JP | 2003-234186 A | 8/2003 |

(Continued)

OTHER PUBLICATIONS

May 4, 2016 Office Action issued in U.S. Appl. No. 14/602,683.

(Continued)

*Primary Examiner* — Xia L Cross
(74) *Attorney, Agent, or Firm* — Oliff PLC

(57) ABSTRACT

A manufacturing method of an organic light emitting device including a light emitting element that includes an organic light emitting layer, a sealing layer above the light emitting element, and a color filter layer above the sealing layer. The color filter layer includes a first color filter that transmits light of a first wavelength region and a second color filter that transmits light of a second wavelength region, an area of the second color filter is smaller than an area of the first color filter, and the method includes forming the first color filter, and forming the second color filter thereafter.

19 Claims, 12 Drawing Sheets

(51) Int. Cl.
*H01L 51/52* (2006.01)
*G02B 5/20* (2006.01)

(52) U.S. Cl.
CPC .............. *H01L 51/50* (2013.01); *H01L 51/52* (2013.01); *H01L 51/5265* (2013.01)

(56) References Cited

U.S. PATENT DOCUMENTS

| | | | |
|---|---|---|---|
| 8,022,625 B2 | 9/2011 | Hayashi | |
| 8,059,233 B2 | 11/2011 | Ishihara et al. | |
| 9,111,881 B2 | 8/2015 | Hanamura | |
| 2001/0030322 A1 | 10/2001 | Yamazaki et al. | |
| 2001/0040645 A1* | 11/2001 | Yamazaki | G02F 1/133305 349/42 |
| 2003/0107314 A1* | 6/2003 | Urabe | H01L 27/322 313/506 |
| 2004/0207321 A1 | 10/2004 | Nishikawa et al. | |
| 2005/0139834 A1* | 6/2005 | Park | H01L 27/322 257/72 |
| 2007/0123135 A1 | 5/2007 | Yang et al. | |
| 2008/0218071 A1 | 9/2008 | Kobayashi | |
| 2008/0284331 A1 | 11/2008 | Hayashi | |
| 2009/0023084 A1* | 1/2009 | Ohnishi | G02B 5/223 430/7 |
| 2009/0268132 A1* | 10/2009 | Takama | G02F 1/13338 349/106 |
| 2011/0026099 A1* | 2/2011 | Kwon | G02F 1/167 359/296 |
| 2011/0051054 A1* | 3/2011 | Wang | G02F 1/136277 349/106 |
| 2011/0101888 A1 | 5/2011 | Uchida | |
| 2012/0038267 A1* | 2/2012 | Hanamura | H01L 27/322 313/504 |
| 2012/0127140 A1* | 5/2012 | Ryan | G09G 3/3648 345/207 |
| 2013/0020934 A1* | 1/2013 | Iwasaki | H01L 27/322 313/504 |
| 2014/0117334 A1 | 5/2014 | Nakamura et al. | |

FOREIGN PATENT DOCUMENTS

| | | |
|---|---|---|
| JP | 2004-227851 A | 8/2004 |
| JP | 2010-027265 A | 2/2010 |
| JP | 2010-237384 A | 10/2010 |
| JP | 2012-018868 A | 1/2012 |
| JP | 2012-038677 A | 2/2012 |

OTHER PUBLICATIONS

Aug. 12, 2016 Office Action issued in U.S. Appl. No. 14/602,683.
Oct. 21, 2016 Office Action issued in U.S. Appl. No. 14/602,683.
Mar. 3, 2017 Office Action issued in U.S Appl. No. 14/602,683.
Feb. 3, 2016 Office Action issued in U.S. Appl. No. 14/602,683.

\* cited by examiner

MANUFACTURING METHOD OF ORGANIC LIGHT EMITTING DEVICE, ORGANIC LIGHT EMITTING DEVICE AND ELECTRONIC APPARATUS

CROSS REFERENCE

This application is a Division of U.S. application Ser. No. 14/602,683, filed Jan. 22, 2015, which claims priority to Japanese Patent Application No. 2014-026322, filed Feb. 14, 2014. The entire contents of both applications are hereby incorporated by reference.

BACKGROUND

1. Technical Field

The present invention relates to a manufacturing method of an organic light emitting device, an organic light emitting device that is manufactured by the manufacturing method, and an electronic apparatus in which the organic light emitting device is equipped.

2. Related Art

In comparison with non-light emitting type display apparatuses such as liquid crystal apparatuses, organic electroluminescence (hereinafter, referred to as EL) devices have an advantage from a point of thinning and weight reduction since backlighting is not required as a light source, and therefore, application in the display units of microdisplays such as head-mounted displays and electronic viewfinders is anticipated. Furthermore, miniaturization and increases in the density of pixels are progressing in the display units of head-mounted displays and electronic viewfinders, and therefore, the area of the pixels is becoming increasingly small.

For example, JP-A-2001-126864 suggests an organic EL device in which a light emitting layer, a transparent electrode (the cathode), a transparent protective layer, and a color filter layer are laminated in order on a substrate on which an anode is provided. The color filter layer has a color filter (a coloring layer) of a predetermined color phase for each pixel, and is formed at a low temperature in order to suppress deterioration of the light emitting layer.

In organic EL devices that have two or more subpixels of different color phases, the areas of light emitting regions in subpixels are changed in order to obtain a predetermined color balance (for example, white balance), and/or in order to reduce a current load (for example, a current density) to an organic EL device in predetermined subpixels beyond that in other subpixels. For example, there are instances in which the areas of the light emitting regions in blue subpixels are greater than those of other subpixels (for example, green subpixels).

In the organic EL device that is disclosed in JP-A-2001-126864, in a case in which the areas of the light emitting regions of the subpixels are changed, the areas of color filters that correspond to predetermined subpixels (for example, green subpixels) become smaller than the areas of other color filters (for example, blue subpixels).

If the color filter layer is formed at a low temperature in order to suppress deterioration of the light emitting layer, adhesion of the color filter layer becomes weak in comparison with cases in which the color filter layer is formed at high temperature. Furthermore, since the areas of the color filters that correspond to predetermined subpixels are smaller than the areas of other color filters, the adhesion of the color filters that correspond to predetermined subpixels becomes even weaker. Therefore, there is a problem in that the adhesion of color filters that correspond to predetermined subpixels is weak, and likely to peel away in comparison with the color filters that correspond to other subpixels.

SUMMARY

The invention can be realized in the following forms or application examples.

Application Example 1

According to this application example, there is provided a manufacturing method of an organic light emitting device that includes a light emitting element that includes an organic light emitting layer, a sealing layer above the light emitting element, and a color filter layer above the sealing layer, in which the color filter layer includes a first color filter that transmits light of a first wavelength region and a second color filter that transmits light of a second wavelength region, and in which an area of the second color filter is smaller than an area of the first color filter, the method including forming the first color filter, and forming the second color filter thereafter.

Since the area of the second color filter is smaller than the area of the first color filter, the adhesion of the second color filter with the sealing layer is weak in comparison with the first color filter. In this application example, since the second color filter is formed after the first color filter has been formed, the second color filter is not influenced by the effects of forming the first color filter. For example, it is possible to suppress defects such as the second color filter peeling away due to being influenced by mechanical stress in the forming of the first color filter, that is, a defect that is generated as a result of the adhesion of the second color filter being weak.

Therefore, in the manufacturing method according to this application example, defects of the adhesion of the second color filter being weak, for example, peeling away of the second color filter, are suppressed, and therefore, it is possible to stably manufacture an organic light emitting device.

Application Example 2

In the manufacturing method of an organic light emitting device according to the application example, it is preferable that the color filter layer further include a third color filter that transmits light of a third wavelength region, an area of the third color filter be the same as the area of the second color filter, or larger than the area of the second color filter, and the third color filter be formed before the forming of the second color filter.

Since the area of the second color filter is the same as the area of the third color filter, or smaller than the area of the third color filter, the adhesion of the second color filter with the sealing layer is the same as or weaker than that of the third color filter.

In this application example, since the second color filter is formed after the third color filter has been formed, the second color filter is not influenced by the effects of forming the third color filter. For example, it is possible to suppress defects such as the second color filter peeling away due to being influenced by mechanical stress in the forming of the third color filter, that is, a defect that is generated as a result of the adhesion of the second color filter being weak.

Application Example 3

In the manufacturing method of an organic light emitting device according to the application example, it is preferable that the light emitting element include an insulating film that suppresses the emission of light of the organic light emitting layer, and the method further include forming a transparent layer between the sealing layer and the color filter layer in a portion that overlaps with the insulating film in a plan view before the forming of the first color filter.

A region in which the insulating film is provided becomes a region in which the emission of the light of the light emitting layer is suppressed, and becomes a region in which the transparent layer is formed. A region in which the insulating film is not provided becomes a region in which the light emitting layer emits light, and becomes a region in which the color filters are formed. The transparent layer forms partitions between regions in which the color filters are formed, and for example, is positioned at a boundary portion of the first color filter and the second color filter. By forming the first color filter and the second color filter in order after the transparent layer has been formed, it is possible to suppress defects in which a color phase of the first color filter is changed due to the second color filter flowing onto a side of the first color filter at the boundary portions between the first color filter and the second color filter, for example.

Application Example 4

In the manufacturing method of an organic light emitting device according to the application example, it is preferable that a process temperature of forming the color filter layer be less than or equal to 110° C.

By forming the color filter layer at a low temperature of less than or equal to 110° C., it is possible to suppress thermal degradation of the organic light emitting device.

Application Example 5

In the manufacturing method of an organic light emitting device according to the application example, it is preferable that the color filters that configure the color filter layer be formed in a striped form.

If the color filter layer is formed in a striped form that extends over a plurality of pixels, an area of the color filter layer is larger than that in a case in which the color filter layer is formed in an island form for each pixel, and therefore, it is possible to enhance the adhesion of the color filter layer.

Application Example 6

According to this application example, there is provided an organic light emitting device including a light emitting element that includes an organic light emitting layer, a sealing layer above the light emitting element, and a color filter layer above the sealing layer, in which the color filter layer includes a first color filter that transmits light of a first wavelength region and a second color filter that transmits light of a second wavelength region, an area of the second color filter is smaller than an area of the first color filter, and the second color filter is provided so as to cover an end part of the first color filter in a portion in which the first color filter and the second color filter are adjacent.

In this application example, since the area of the second color filter is smaller than the area of the first color filter, the adhesion of the second color filter with the sealing layer becomes weaker than that of the first color filter.

By providing the second color filter so as to cover an end part of the first color filter, or in other words, by forming the second color filter to have a portion that overlaps with the first color filter in a planar fashion, it is possible to make the area of a portion in which the second color filter comes into contact with components other than the sealing layer larger than a case in which the second color filter does not overlap with the first color filter in a planar fashion, and therefore, to enhance the adhesion of the second color filter.

Furthermore, the second color filter includes a portion that comes into contact with a material of the same kind (the first color filter) in addition to a portion that comes into contact with a material of a different kind (the sealing layer). In the portion that comes into contact with a material of the same kind, the wettability and affinity (ease of attachment) of the second color filter are improved, and therefore, it is possible to enhance the adhesion of the second color filter.

Accordingly, it is possible to suppress defects that result from the adhesion of the second color filter being weak, for example, the second color filter peeling away.

Application Example 7

In the organic light emitting device according to the application example, it is preferable that the color filter layer further include a third color filter that transmits light of a third wavelength region and has an area that is the same as the area of the second color filter, or larger than the area of the second color filter, and the second color filter be provided so as to cover an end part of the third color filter in a portion in which the second color filter and the third color filter are adjacent.

By providing the second color filter so as to cover an end part of the third color filter, or in other words, by forming the second color filter to have a portion that overlaps with the third color filter in a planar fashion, it is possible to make the area of a portion in which the second color filter comes into contact with components other than the sealing layer larger than a case in which the second color filter does not overlap with the third color filter in a planar fashion, and therefore, to enhance the adhesion of the second color filter.

Furthermore, the second color filter includes a portion that comes into contact with a material of the same kind (the third color filter) in addition to a portion that comes into contact with a material of a different kind (the sealing layer). In the portion that comes into contact with a material of the same kind, the wettability and affinity (ease of attachment) of the second color filter are improved, and therefore, it is possible to enhance the adhesion of the second color filter.

Accordingly, it is possible to suppress defects that result from the adhesion of the second color filter being weak, for example, the second color filter peeling away. Therefore, in the organic light emitting device, faults that are caused by the second color filter peeling away are suppressed, and it is possible to provide a high-definition display (a display that is flawless or in which there are few faults).

Application Example 8

In the organic light emitting device according to the application example, it is preferable that a transparent layer be disposed between the sealing layer and the color filter layer in a portion in which the first color filter and the second color filter are adjacent.

The transparent layer is disposed in a portion in which the first color filter and the second color filter are adjacent, and therefore, it is possible to suppress defects in which a color phase of the first color filter is changed due to the second color filter flowing onto a side of the first color filter, for example.

Application Example 9

In the organic light emitting device according to the application example, it is preferable that a transparent layer be disposed between the sealing layer and the color filter layer in a portion in which the second color filter and the third color filter are adjacent.

The transparent layer is disposed in a portion in which the second color filter and the third color filter are adjacent, and therefore, it is possible to suppress defects in which a color phase of the third color filter is changed due to the second color filter flowing onto a side of the third color filter, for example.

Application Example 10

In the organic light emitting device according to the application example, it is preferable that the color filters that configure the color filter layer have a striped form.

The area of a striped form color filter layer that is formed to extend over a plurality of pixels is larger than that of an island form color filter layer that is formed for each pixel, and therefore, the adhesion of the color filter layer is stronger.

Application Example 11

According to this application example, there is provided an electronic apparatus that includes the organic light emitting devices that are set forth in the abovementioned application examples.

In the organic light emitting devices that are set forth in the abovementioned application examples, faults that are caused by the second color filter peeling away, are suppressed, and it is possible to provide a high-definition display (a display that is flawless or in which there are few faults). Therefore, the electronic apparatus in which the organic light emitting devices that are set forth in the abovementioned application examples are provided can also provide a high-definition display. For example, it is possible to apply an electro-optical device that is set forth in the abovementioned application examples to an electronic apparatus that has a display unit such as a head-mounted display, a heads-up display, an electronic viewfinder of a digital camera, a portable information terminal, a navigator or the like.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
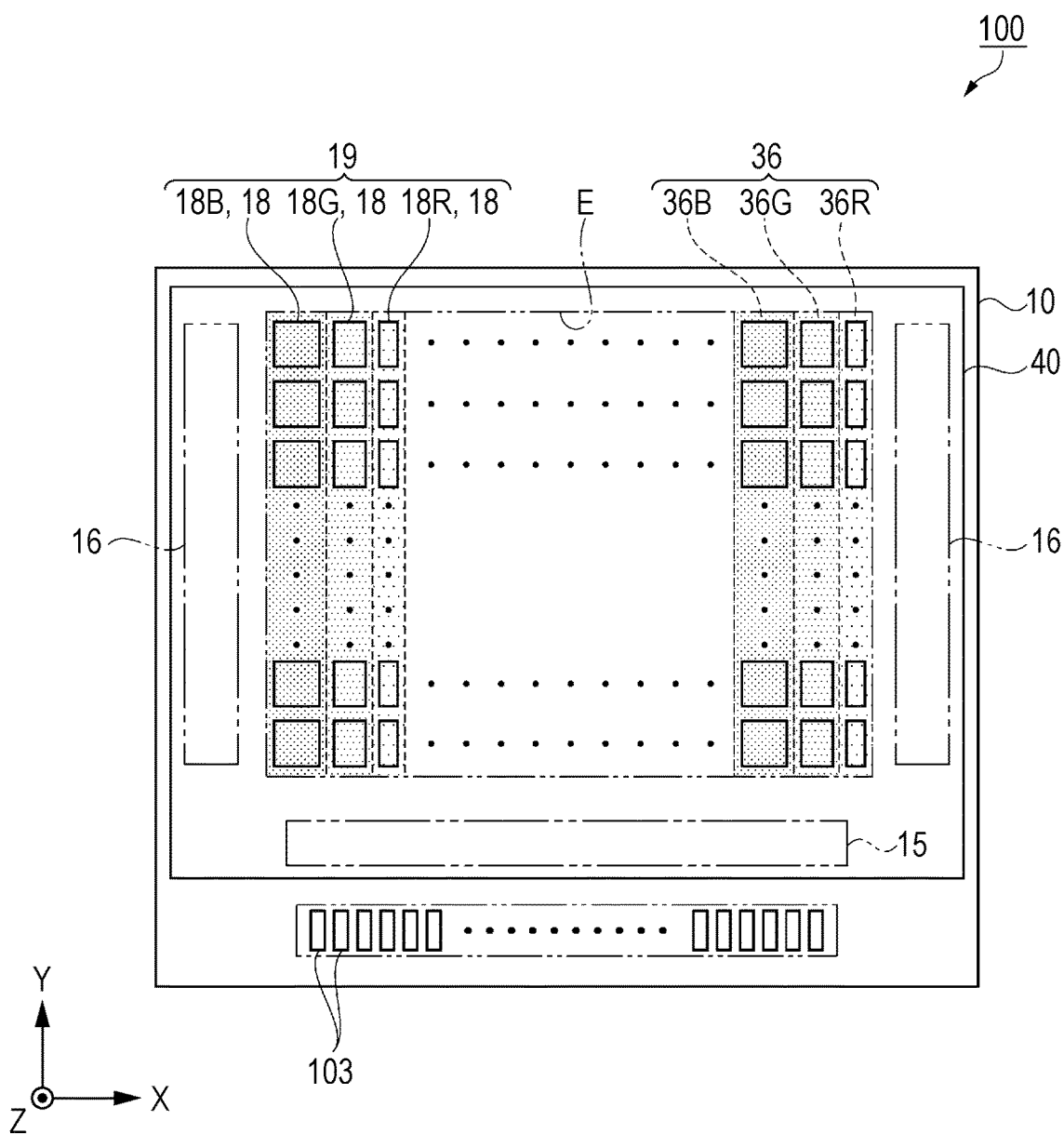
FIG. 1 is a schematic plan view that shows a summary of an organic EL device according to Embodiment 1.

Hereinafter, embodiments of the present invention will be described with reference to the drawings. The embodiments merely indicate an aspect of the present invention, and do not limit the invention, and it is possible to make changes in an arbitrary manner within the scope of the technical idea of the present invention. In addition, in each of the following drawings, in order to make each layer and each site have a size of an extent that can be clearly recognized in the drawing, a reduced scale of each layer and each site differs from a practical scale.

Embodiment 1

Summary of Organic EL Device

An organic EL device 100 according to Embodiment 1 is an example of "an organic light emitting device" in the present invention, and is a self-light emitting microdisplay that is suitable for use in a display unit of a head-mounted display that will be described later.

Figure 2:
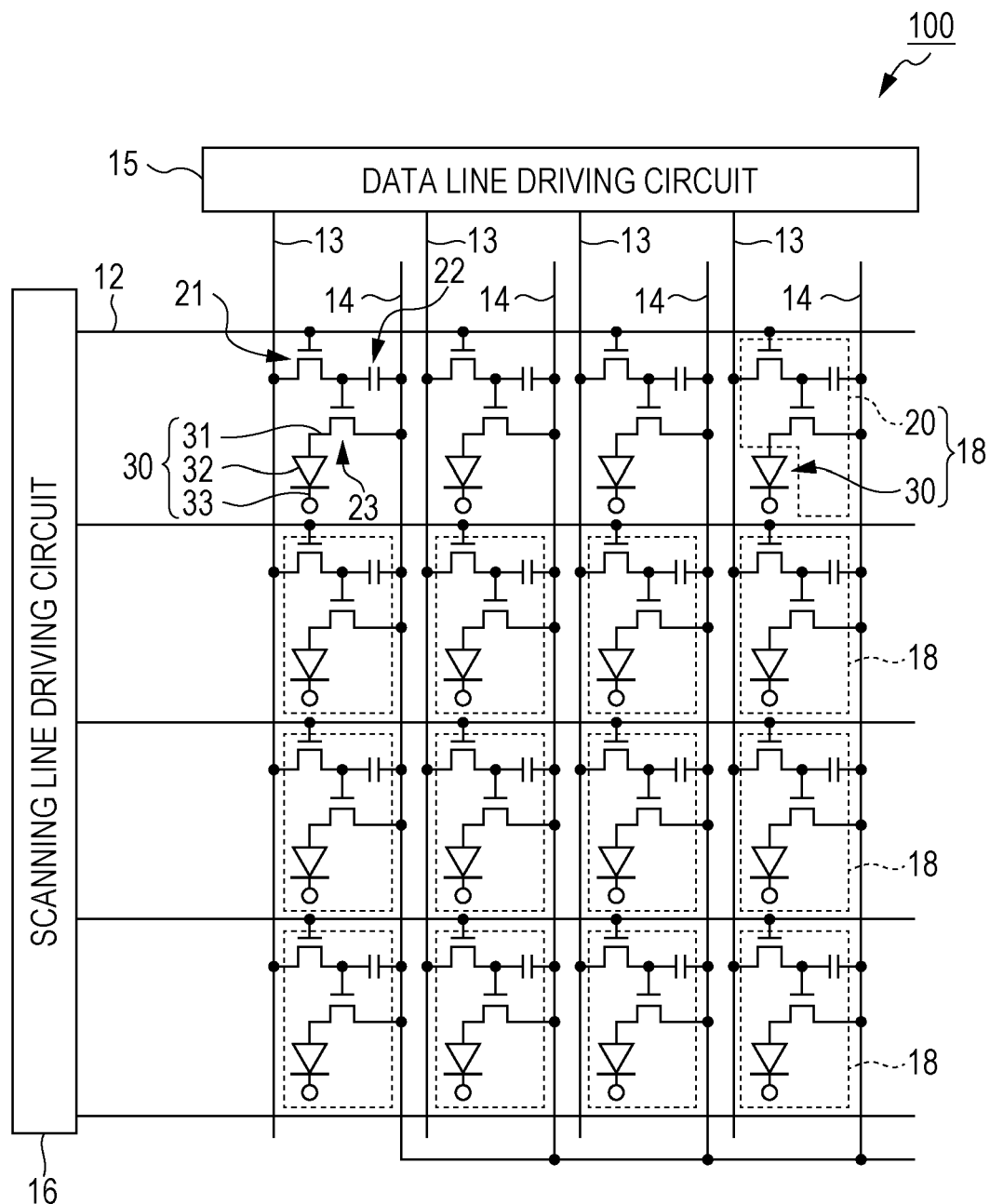
FIG. 2 is an equivalent circuit diagram that shows an electrical configuration of the organic EL device according to Embodiment 1.

FIG. 1 is a schematic plan view that shows a summary of an organic EL device according to the present embodiment. FIG. 2 is an equivalent circuit diagram that shows an electrical configuration of the organic EL device according to the present embodiment.

Firstly, a summary of the organic EL device 100 according to the present embodiment will be described with reference to FIG. 1 and FIG. 2.

As shown in FIG. 1, the organic EL device 100 according to the present embodiment includes an element substrate 10 and a protective substrate 40. Both substrates are bonded to each other using a resin layer 42 (refer to FIG. 4) that will be described later.

The element substrate 10 includes a display region E in which subpixels 18B that emit blue light, subpixels 18G that emit green light and subpixels 18R that emit red light are arranged in a matrix form. In the organic EL device 100, a full color display, in which pixels 19 that are formed from the subpixels 18B, the subpixels 18G and the subpixels 18R form display units, is provided.

In the following description, there are cases in which the subpixels 18B, the subpixels 18G and the subpixels 18R are referred to as a subpixel 18.

A plurality of terminals for connection to the outside 103 are arranged along a first side of the element substrate 10. A data line drive circuit 15 is provided between the plurality of terminals for connection to the outside 103 and the display region E. Scanning line drive circuits 16 are provided between the display region E, and a second side and a third side that are orthogonal to the first side and mutually oppose one another.

The protective substrate 40 is smaller than the element substrate 10, and is disposed in a manner in which the terminals for connection to the outside 103 are exposed. The protective substrate 40 is a translucent insulating substrate, and can use a quartz substrate, a glass substrate or the like. The protective substrate 40 has a role of protecting in a manner in which damage is not caused to organic EL elements 30 (refer to FIG. 2) which are disposed in the display region E, and which will be described later, and is provided to be wider than the display region E.

Hereinafter, a direction along the first side will be set as an X direction. A direction along the two other sides (the second side and the third side) that are orthogonal to the first side and mutually oppose one another will be set as a Y direction. A direction from the element substrate 10 toward the protective substrate 40 will be set as a Z direction.

A color filter layer 36 is provided in the display region E. The color filter layer 36 is configured by coloring layers 36B (hereinafter, referred to as the blue coloring layers 36B) that transmit blue light, coloring layers 36G (hereinafter, referred to as the green coloring layers 36G) that transmit green light and coloring layers 36R (hereinafter, referred to as the red coloring layers 36R) that transmit red light.

Additionally, blue light is an example of "light of a first wavelength region" in the present invention, red light is an example of "light of a second wavelength region" in the present invention, and green light is an example of "light of a third wavelength region" in the present invention. The blue coloring layers 36B are an example of a "first color filter" in the present invention, the red coloring layers 36R are an example of a "second color filter" in the present invention, and the green coloring layers 36G are an example of a "third color filter" in the present invention.

The blue coloring layers 36B are disposed in a plurality of subpixels 18B, and form a striped form that extends in the Y direction. The green coloring layers 36G are disposed in a plurality of subpixels 18G, and form a striped form that extends in the Y direction. The red coloring layers 36R are disposed in a plurality of subpixels 18R, and form a striped form that extends in the Y direction.

A length of the coloring layers 36B, 36G and 36R in the X direction becomes smaller in the order of the blue coloring layers 36B, the green coloring layers 36G and the red coloring layers 36R. Lengths of the blue coloring layers 36B, the green coloring layers 36G and the red coloring layers 36R in the Y direction are respectively the same. Therefore, an area of the coloring layers 36B, 36G and 36R becomes smaller in the order of the blue coloring layers 36B, the green coloring layers 36G and the red coloring layers 36R.

As shown in FIG. 2, the organic EL device 100 includes a plurality of scanning lines 12 and a plurality of data lines 13 that mutually intersect one another, and a plurality of power source lines 14 that are respectively arranged in line with the plurality of data lines 13. The scanning lines 12 are connected to the scanning line drive circuits 16, and the data lines 13 are connected to the data line drive circuit 15. In addition, the organic EL device 100 has a plurality of subpixels 18 that are disposed in a matrix form to correspond to each intersecting part of the plurality of scanning lines 12 and the plurality of data lines 13.

The subpixel 18 includes an organic EL element 30, and a pixel circuit 20 that controls the driving of the organic EL element 30.

The organic EL element 30 includes a pixel electrode 31, an insulating film 28 that will be described later (refer to FIG. 4), a light emission functional layer 32 and an opposing electrode 33. The pixel electrode 31 functions as an anode that supplies positive holes to the light emission functional layer 32. The opposing electrode 33 functions as a cathode that supplies electrons to the light emission functional layer 32. Positive holes that are supplied from the pixel electrode 31 and electrons that are supplied from the opposing electrode 33 are combined by the light emission functional layer 32 and the light emission functional layer 32 emits white light.

The organic EL element 30 is an example of a "light emitting element" in the present embodiment.

The pixel circuit 20 includes a transistor for switching 21, a storage capacitance 22, and a transistor for driving 23. The two transistors 21 and 23 can be configured using for example, an n-channel type or a p-channel type transistor.

The gate of the transistor for switching 21 is connected to the scanning line 12. Either one of the source and the drain of the transistor for switching 21 is connected to the data line 13. The other of the source and the drain of the transistor for switching 21 is connected to the gate of the transistor for driving 23.

Either one of the source and the drain of the transistor for driving 23 is connected to the pixel electrode 31 of the organic EL element 30. The other of the source and the drain of the transistor for driving 23 is connected to the power source line 14. The storage capacitance 22 is connected between the gate of the transistor for driving 23 and the power source line 14.

When the scanning line 12 is driven and the transistor for switching 21 attains an ON state, a potential that is based on an image signal that is supplied from the data line 13 at that time is saved in the storage capacitance 22 via the transistor for switching 21. An ON/OFF state of the transistor for driving 23 is determined depending on a potential of the storage capacitance 22, that is, a gate potential of the transistor for driving 23. Further, when the transistor for driving 23 attains an ON state, a current of an amount that depends on a gate potential flows from the power source line 14 to the light emission functional layer 32 that is interposed between the pixel electrode 31 and the opposing electrode 33 via the transistor for driving 23. The organic EL element 30 emits light depending on an amount of the current that flows to the light emission functional layer 32.

Summary of Subpixels

Figure 3:
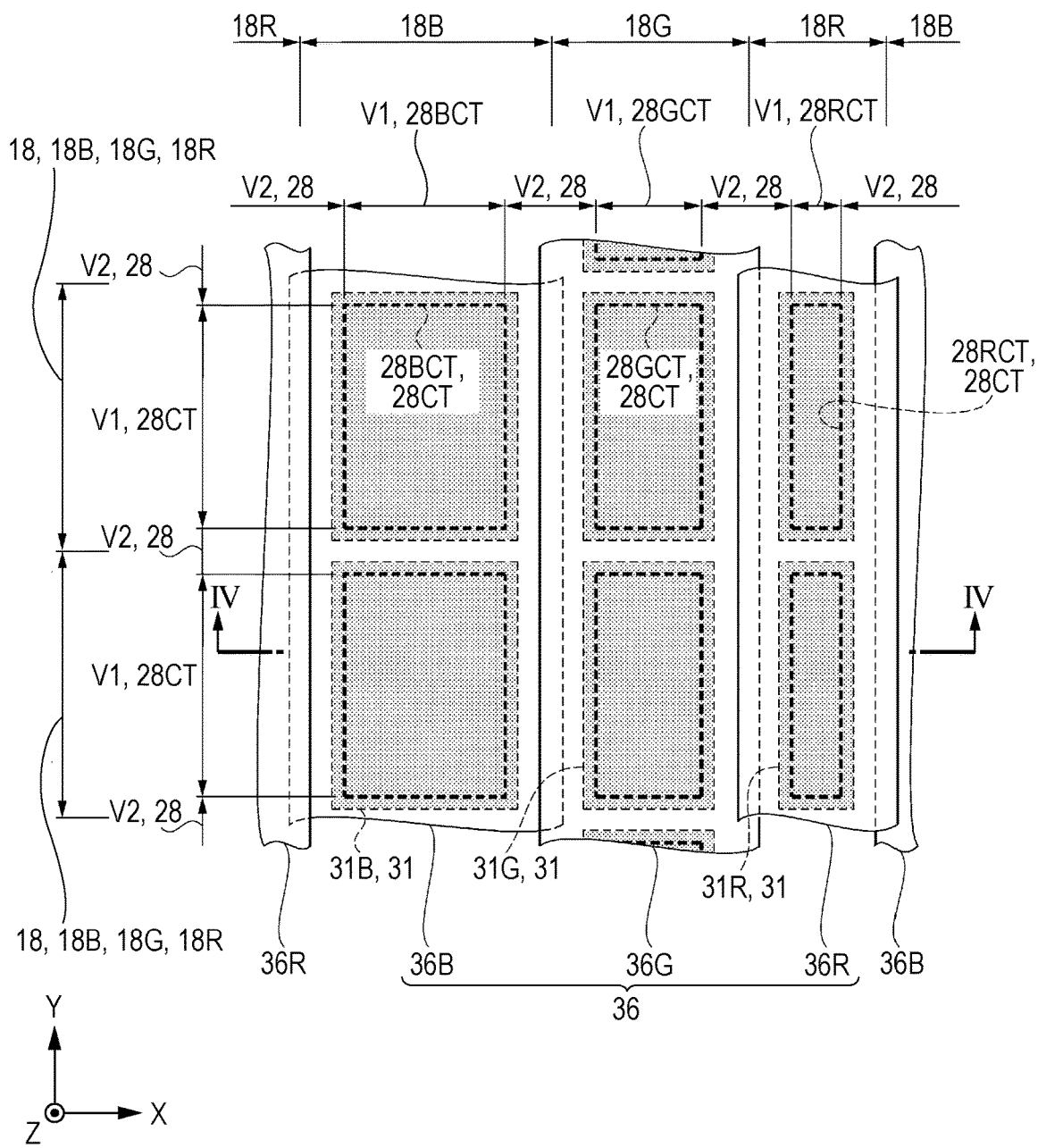
FIG. 3 is a schematic plan view that shows a configuration of subpixels.

FIG. 3 is a schematic plan view that shows a configuration of subpixels. In FIG. 3, among the constituent elements of the subpixels 18, the pixel electrode 31, the insulating film 28, and the coloring layers 36B, 36G and 36R are illustrated, and other constituent elements are not illustrated.

Next, a configuration of the subpixels 18 and a planar arrangement thereof will be described with reference to FIG. 3.

As shown in FIG. 3, the subpixels 18R in which the red coloring layers 36R are disposed, the subpixels 18G in which the green coloring layers 36G are disposed, and the subpixels 18B in which the blue coloring layers 36B are disposed have a striped form that extends in the Y direction, and are disposed in order in the X direction.

A length of the subpixels 18 in the X direction becomes smaller in the order of the subpixels 18B, the subpixels 18G, and the subpixels 18R. Lengths of the subpixels 18 in the Y direction are the same for the subpixels 18B, the subpixels 18G, and the subpixels 18R. Therefore, an area of the subpixels 18 becomes smaller in the order of the subpixels 18B, the subpixels 18G and the subpixels 18R.

Additionally, the length of the subpixels 18 in the X direction and the length of the subpixels 18 in the Y direction are respectively less than 10 µm.

The pixel electrodes 31 are disposed in the subpixels 18. The length of the pixel electrode 31 in the X direction becomes smaller in the order of pixel electrodes 31B that are disposed in the subpixels 18B, pixel electrodes 31G that are disposed in the subpixels 18G, and pixel electrodes 31R that are disposed in the subpixels 18R. Lengths of the pixel electrodes 31 in the Y direction are respectively the same for the pixel electrodes 31B, the pixel electrodes 31G and the pixel electrodes 31R. Therefore, the areas of the pixel electrodes 31 become smaller in the order of the pixel electrodes 31B, the pixel electrodes 31G and the pixel electrodes 31R.

Figure 4:
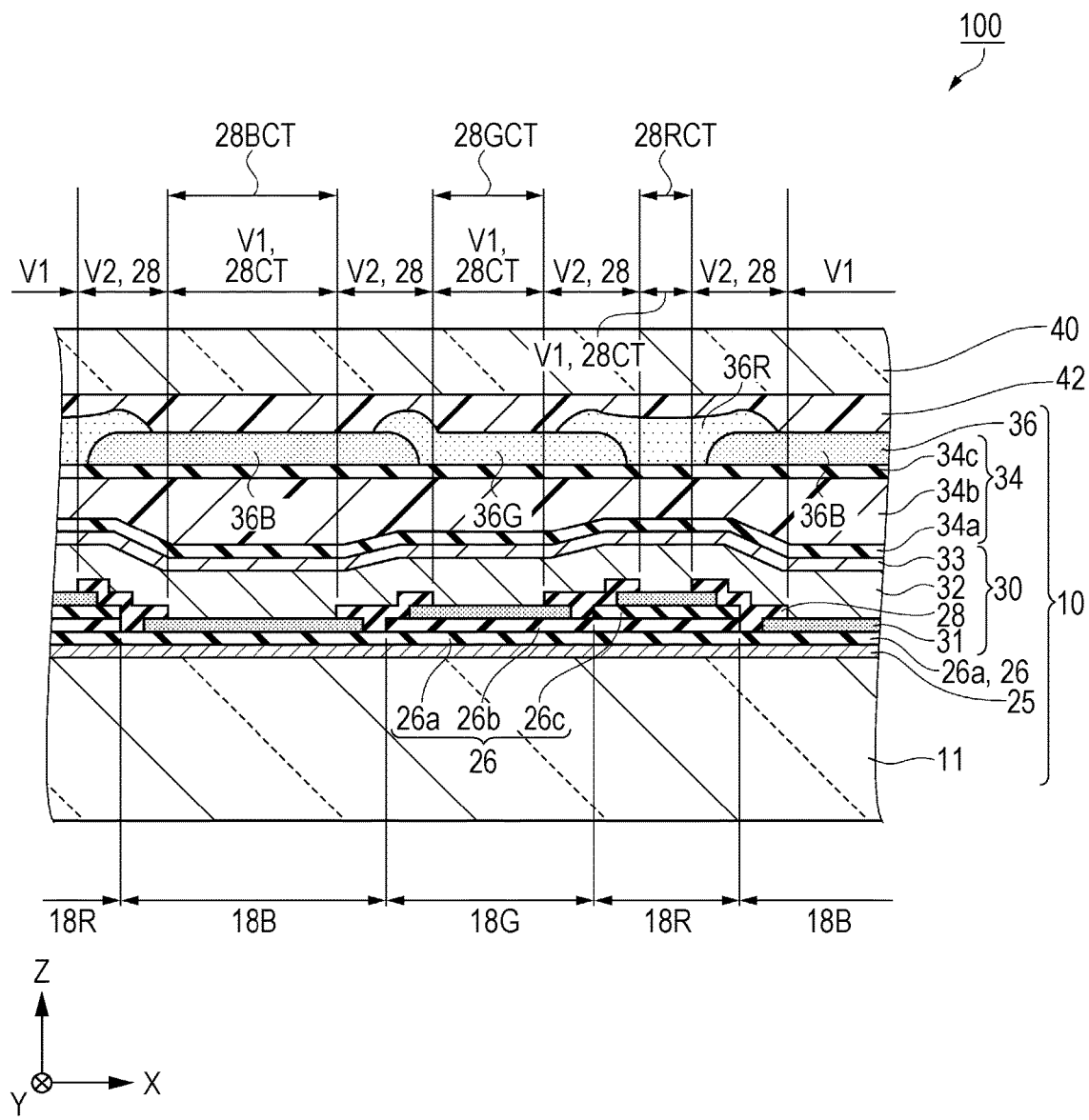
FIG. 4 is a schematic cross-sectional view that shows a configuration of the organic EL device along a line IV-IV of FIG. 3.

The insulating film 28 is disposed between the pixel electrodes 31 and the light emission functional layer 32 (refer to FIG. 4). The insulating film 28 and the light emission functional layer 32 are disposed across substantially the entire surface of the display region E. The pixel electrodes 31 are disposed in an island form respectively for each of the plurality of subpixels 18. A region that is surrounded by the thick broken line in the drawing is a region in which the insulating film 28 is not provided. The insulating film 28 is disposed so as to cover a peripheral part of the pixel electrodes 31, and has openings 28CT (28BCT, 28GCT and 28RCT) that expose the pixel electrode 31. In other words, openings 28BCT that expose the pixel electrodes 31B of the subpixels 18B, openings 28GCT that expose the pixel electrodes 31G of the subpixels 18G, and openings 28RCT that expose the pixel electrodes 31R of the subpixels 18R are provided in the insulating film 28. Furthermore, the areas of the openings 28CT become smaller in the order of the openings 28BCT of the subpixels 18B, the openings 28GCT of the subpixels 18G and the openings 28RCT of the subpixels 18R.

Additionally, the insulating film 28 is an example of an "insulating film that controls the emission of light" in the present embodiment, and suppresses a circumstance in which a leakage current flows between adjacent pixel electrodes 31.

The pixel electrodes 31 and the light emission functional layer 32 come into contact with each other in portions in which the openings 28CT are provided, positive holes are supplied to the light emission functional layer 32 from the pixel electrodes 31, and the light emission functional layer 32 emits light. In other words, portions in which the openings 28CT are provided become light emission regions V1 in which the light emission functional layer 32 emits light. The openings 28BCT become light emission regions V1 that emit blue light. The openings 28GCT become light emission regions V1 that emit green light. The openings 28RCT become light emission regions V1 that emit red light.

The supply of positive holes from the pixel electrodes 31 to the light emission functional layer 32 is suppressed in portions in which the insulating film 28 is provided, and therefore, the emission of the light of the light emission functional layer 32 is suppressed. In other words, the portions in which the insulating film 28 is provided become light emission suppression regions V2 in which the emission of light of the light emission functional layer 32 is suppressed.

If the light emission functional layer 32 emits light for a long period of time, or in other words, if a current flows to the light emission functional layer 32 for a long period of time, degradation of the light emission functional layer 32 in which the brightness of the light that is emitted by the light emission functional layer 32 gradually decreases, proceeds. The degradation of the light emission functional layer 32 changes due to a current density that flows through the light emission functional layer 32, and if the current density that is flowing in the light emission functional layer 32 becomes large, the light emission functional layer 32 degrades rapidly. Furthermore, the degradation of the light emission functional layer 32 differs depending on an organic light emitting material that configures the light emission functional layer 32, and organic light emitting materials that emit colors on a short wavelength side tend to degrade rapidly in comparison with organic light emitting materials that emit colors on a long wavelength side. For example, organic light emitting materials that emit blue light tend to degrade rapidly in comparison with organic light emitting materials that emit red light.

Therefore, in the present embodiment, the areas of the light emission regions V1 that emit blue light (the openings 28BCT) are set to be larger than the areas of light emission regions V1 that emit red light (the openings 28RCT). This is a configuration for obtaining a predetermined color balance (for example, white balance) as a result of light from the subpixels 18B, the subpixels 18G and the subpixels 18R, and/or for reducing current densities in the light emission regions V1 (the openings 28BCT) beyond those in the light emission region V1 (the openings 28RCT).

In more detail, the areas of the light emission regions V1 (the openings 28CT) become smaller in the order of the light emission regions V1 that emit blue light (the openings 28BCT), the light emission regions V1 that emit green light (the openings 28GCT), and the light emission regions V1 that emit red light (the openings 28RCT).

The blue coloring layers 36B extend in the X direction over the light emission suppression regions V2 that oppose each other by interposing the light emission regions V1 that emit blue light (the openings 28BCT) therebetween, and are disposed in a manner in which end parts thereof overlap with the red coloring layers 36R and the green coloring layers 36G in a planar fashion.

The green coloring layers 36G extend in the X direction over the light emission suppression regions V2 that oppose each other by interposing the light emission regions V1 that emit green light (the openings 28GCT) therebetween, and are disposed in a manner in which end parts thereof overlap with the blue coloring layers 36B and the red coloring layers 36R in a planar fashion.

The red coloring layers 36R extend in the X direction over the light emission suppression regions V2 that oppose each other by interposing the light emission regions V1 that emit red light (the openings 28RCT) therebetween, and are disposed in a manner in which end parts thereof overlaps with the green coloring layers 36G and the blue coloring layers 36B in a planar fashion.

Cross-Sectional Structure of the Organic EL Device

FIG. 4 is a schematic cross-sectional view that shows a configuration of an organic EL device along a line IV-IV of FIG. 3.

Next, a cross-sectional structure of the organic EL device 100 will be described with reference to FIG. 4.

As shown in FIG. 4, in the organic EL device 100, the element substrate 10, a resin layer 42 and the protective substrate 40 are laminated in order in the Z direction.

The resin layer 42 has a role of bonding the element substrate 10 and the protective substrate 40, and for example, can use an epoxy resin or an acrylic resin.

The element substrate 10 includes a substrate 11, a reflective layer 25, an optical distance adjustment layer 26, the organic EL element 30, a sealing layer 34 and the color filter layer 36 which are laminated on the substrate 11 in order in the Z direction.

The substrate 11 is a transistor substrate on which the scanning lines 12, the data lines 13, the power source lines 14, the data line drive circuit 15, the scanning line drive circuits 16, the transistors for switching 21, the storage capacitances 22, the transistors for driving 23 (refer to FIG. 2) and the like are formed on a semiconductor substrate that is made from silicon for example, using a publicly-known method.

Additionally, the base material of the substrate 11 is not limited to silicon, and for example, may be any translucent insulating substrate such as quartz or glass.

The reflective layer 25 is one reflective layer of a pair of reflective layers that reflect light that is emitted by the light emission functional layer 32. The reflective layer 25 is formed by a highly reflective material, and is disposed to extend over the plurality of subpixels 18. As the formation material of the reflective layer 25, for example, it is possible to use aluminum, silver or the like.

The optical distance adjustment layer 26 is configured by a first insulating film 26*a*, a second insulating film 26*b* and a third insulating film 26*c*. The first insulating film 26*a* is provided on the reflective layer 25, and is disposed on the subpixels 18B, the subpixels 18G and the subpixels 18R. The second insulating film 26*b* is provided on the first insulating film 26*a*, and is disposed on the subpixels 18G and the subpixels 18R. The third insulating film 26*c* is provided on the second insulating film 26*b*, and is disposed on the subpixels 18R. As a result of this, a thickness of the optical distance adjustment layer 26 becomes greater in the order of the subpixels 18B, the subpixels 18G, and the subpixels 18R.

The organic EL element 30 includes the pixel electrodes 31, the insulating film 28, the light emission functional layer 32, and the opposing electrode 33, which are laminated in order in the Z direction.

The pixel electrodes 31 are configured by, for example, an optically transparent material such as Indium Tin Oxide (ITO), and are formed in an island form for each subpixel 18.

The insulating film 28 is configured by silicon oxide for example, and is disposed so as to cover a peripheral part of the pixel electrodes 31. In the abovementioned manner, the insulating film 28 has the openings 28CT, portions in which the openings 28CT are provided become the light emission regions V1, and portions in which the insulating film 28 is provided become the light emission suppression regions V2.

The light emission functional layer 32 includes a positive hole injection layer, a positive hole transport layer, an organic light emitting layer and an electron transport layer which are laminated in order in the Z direction. The organic light emitting layer emits light that has red, green and blue light components. The organic light emitting layer may be configured by a single layer, or may be configured by a plurality of layers (for example, a blue light emitting layer that emits light with a blue color and a yellow light emitting layer that emits light with red and green colors).

The opposing electrode 33 is, for example, configured by an alloy of Mg and Ag, and is optically transparent and optically reflective. The opposing electrode 33 is the other reflective layer of a pair of reflective layers that reflect light that is emitted by the light emission functional layer 32.

The sealing layer 34 is configured by a first sealing layer 34*a*, a planarization layer 34*b*, and a second sealing layer 34*c*, which are laminated in order in the Z direction, covers the organic EL element 30, and is provided over substantially the entire surface of the element substrate 10. Additionally, apertures (not shown in the drawings) that expose the terminals for connection to the outside 103 (refer to FIG. 1) are provided in the sealing layer 34.

The first sealing layer 34*a* and the second sealing layer 34*c* are configured by a silicon oxynitride that, for example, is formed using a publicly-known plasma Chemical Vapor Deposition (CVD) method or the like, and have high barrier properties with respect to moisture and oxygen.

The planarization layer 34*b* is, for example, configured by an epoxy resin, a coating-type inorganic material (such as a silicon oxide) or the like. The planarization layer 34*b* covers the faults (pinholes and cracks) and foreign substances in the first sealing layer 34*a* or the like, and forms a flat surface.

The color filter layer 36 is configured by the blue coloring layers 36B, the green coloring layers 36G and the red coloring layers 36R, and is disposed in the display region E.

The blue coloring layers 36B are disposed on the second sealing layer 34*c* to extend over the light emission suppression regions V2 that are adjacent to the light emission regions V1 of the subpixels 18B.

The green coloring layers 36G are disposed on the second sealing layer 34*c* to extend over the light emission suppression regions V2 that are adjacent to the light emission regions V1 of the subpixels 18G. The green coloring layers 36G are disposed so as to cover end parts of the blue coloring layers 36B in the light emission suppression regions V2 at the boundary portions between the subpixels 18B and the subpixels 18G.

The red coloring layers 36R are disposed on the second sealing layer 34*c* to extend over the light emission suppression regions V2 that are adjacent to the light emission regions V1 of the subpixels 18R. The red coloring layers 36R are disposed so as to cover end parts of the green coloring layers 36G in the light emission suppression regions V2 at the boundary portions between the subpixels 18G and the subpixels 18R. The red coloring layers 36R are disposed so as to cover end parts of the blue coloring layers 36B in the light emission suppression regions V2 at the boundary portions between the subpixels 18R and the subpixels 18B.

Optical Resonance Structure

In the light emission regions V1, the reflective layer 25 that is optically reflective, the optical distance adjustment layer 26, the pixel electrode 31, the light emission functional layer 32 and the opposing electrode 33 are laminated in order in the Z direction. Light that is emitted by the light emission functional layer 32 is repeatedly reflected between the reflective layer 25 and the opposing electrode 33, and the intensity of light of a specific wavelength (a resonance wavelength), which corresponds to an optical distance between the reflective layer 25 and the opposing electrode 33, is amplified, and is output from the protective substrate 40 in the Z direction as display light.

To explain in more detail, the optical distance adjustment layer 26 has a role of adjusting the optical distance between the reflective layer 25 and the opposing electrode 33. In the subpixels 18B, a film thickness of the optical distance adjustment layer 26 is set so that the resonance wavelength (a peak wavelength at which brightness is at its maximum) becomes 470 nm. In the subpixels 18G, a film thickness of the optical distance adjustment layer 26 is set so that the resonance wavelength becomes 540 nm. In the subpixels 18R, a film thickness of the optical distance adjustment layer 26 is set so that the resonance wavelength becomes 610 nm.

As a result of this, blue light with a peak wavelength of 470 nm is emitted from the subpixels 18B, green light with a peak wavelength of 540 nm is emitted from the subpixels 18G, and red light with a peak wavelength of 610 nm is emitted from the subpixels 18R. In this manner, the organic EL device 100 has an optical resonance structure that amplifies the intensity of light of specific wavelengths, and improves the color purity of the display light that is output from the protective substrate 40 in the Z direction.

That is, the organic EL device 100 has an optical resonance structure, the color purity of display light is improved, and it is possible to provide a high-definition display.

Manufacturing Method of Color Filter Layer

Figure 5:
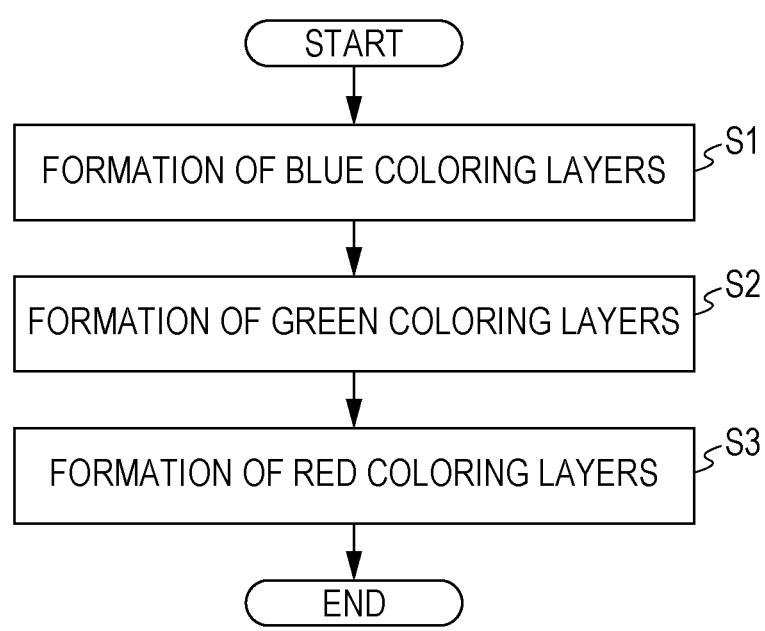
FIG. 5 is a process flow that shows a manufacturing method of a color filter layer.
Figure 6A:
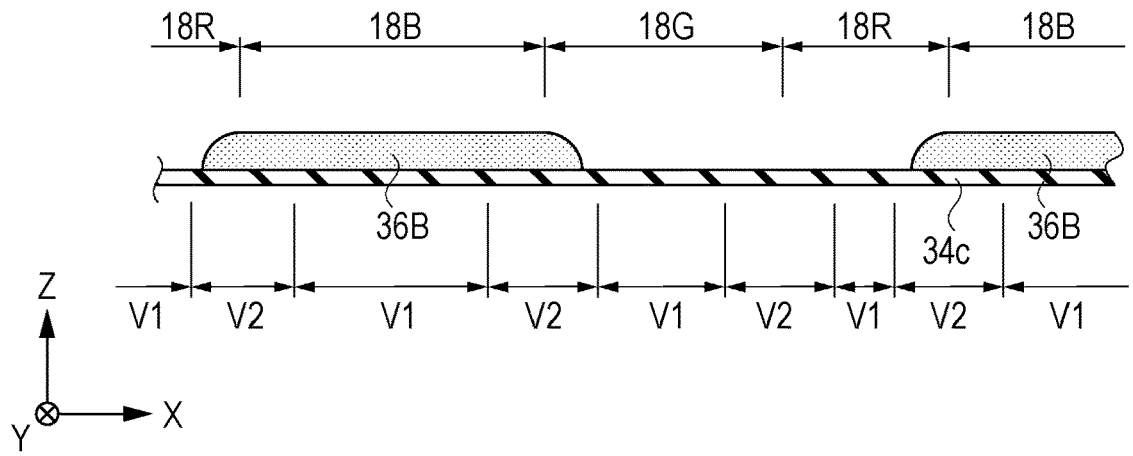
FIGS. 6A, 6B and 6C are schematic cross-sectional views that show states after passing each process of the process flow that is shown in FIG. 5.
Figure 6B:
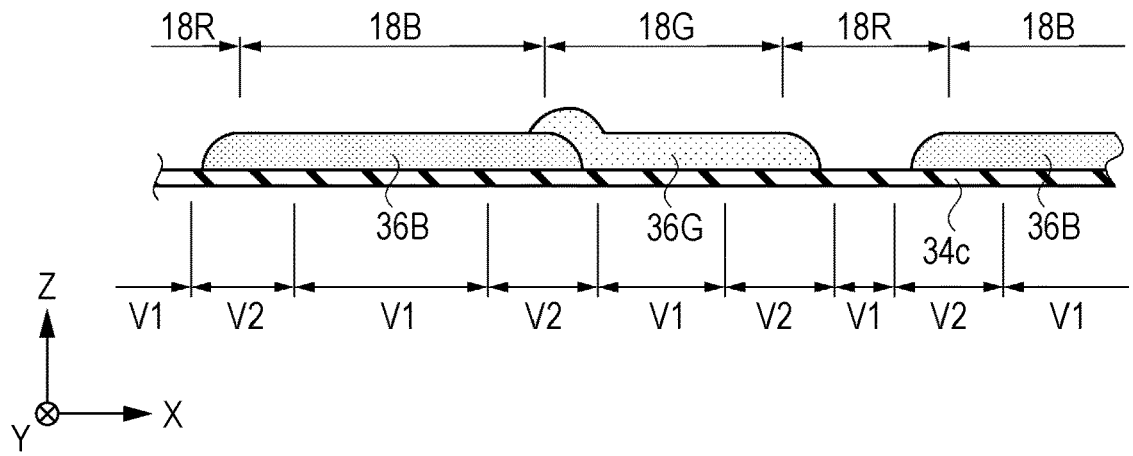
Figure 6C:
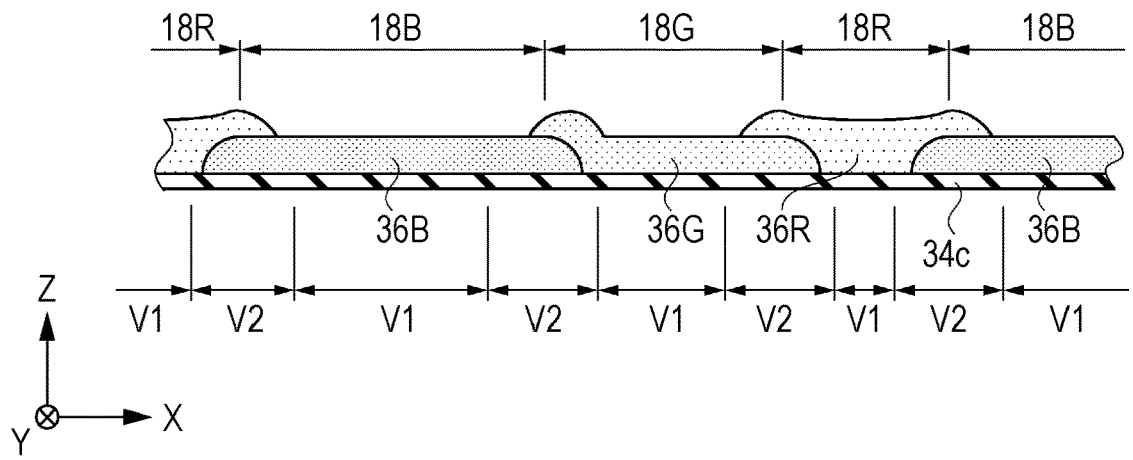

FIG. 5 is a process flow that shows a manufacturing method of the color filter layer. FIGS. 6A, 6B and 6C are views that correspond to FIG. 4 and are schematic cross-sectional views that show states after passing each process of the process flow that is shown in FIG. 5.

Hereinafter, a summary of a manufacturing method of the color filter layer 36 will be described with reference to FIGS. 5 to 6C.

As shown in FIG. 5, the manufacturing method of the color filter layer 36 includes a process of forming the blue coloring layers 36B (Step S1), a process of forming the green coloring layers 36G (Step S2), and a process of forming the red coloring layers 36R (Step S3).

As shown in FIG. 6A, the blue coloring layers 36B are formed on the second sealing layer 34c to extend over the light emission suppression regions V2 that are adjacent to the light emission regions V1 of the subpixels 18B by coating with a photosensitive resist that includes a blue color material (for example, a pigment) to form a blue photosensitive resin layer, exposing and developing the photosensitive resin layer using a photolithography method, and firing the product.

To explain in more detail, a blue photosensitive resin layer is formed by coating with a photosensitive resist that includes a blue color material using a spin-coating method, and drying the product. The blue photosensitive resin layer is, for example, configured by a photosensitive acrylic resin, and a portion that is irradiated with light (exposed) is made insoluble. A region in which the blue coloring layers 36B are formed is irradiated with light (exposed), and unexposed photosensitive resin layer is removed by discharging a developing fluid from nozzles, for example. Next, after washing photosensitive resin layer that was made insoluble by, for example, discharging pure water from nozzles, blue coloring layers 36B of a predetermined shape are formed by firing and curing. Additionally, the photosensitive resin layer is fired at a temperature of 110° C. or a temperature that is less than 110° C. in so that thermal degradation of the light emission functional layer 32 is not caused. In other words, a process temperature of the process of forming the blue coloring layers 36B is less than or equal to 110° C.

As shown in FIG. 6B, the green coloring layers 36G are formed on the second sealing layer 34c to extend over the light emission suppression regions V2 that are adjacent to the light emission regions V1 of the subpixels 18G so as to cover the end parts of the blue coloring layers 36B in the light emission suppression regions V2 at the boundary portions between the subpixels 18B and the subpixels 18G by coating with a photosensitive resist that includes a green color material (for example, a pigment) to form a photosensitive resin layer, exposing and developing the photosensitive resin layer using a photolithography method, and firing the product.

To explain in more detail, a green photosensitive resin layer is formed by coating with a photosensitive resist that includes a green color material using a spin-coating method, and drying the product. The green photosensitive resin layer is, for example, configured by a photosensitive acrylic resin, and a portion that is irradiated with light (exposed) is made insoluble. A region in which the green coloring layers 36G are formed is irradiated with light (exposed), and unexposed photosensitive resin layer is removed by discharging a developing fluid from nozzles, for example. Next, after washing photosensitive resin layer that was made insoluble by, for example, discharging pure water from nozzles, green coloring layers 36G of a predetermined shape are formed by firing and curing. A process temperature of the process of forming the green coloring layers 36G is less than or equal to 110° C.

As shown in FIG. 6C, the red coloring layers 36R are formed on the second sealing layer 34c to extend over the light emission suppression regions V2 that are adjacent to the light emission regions V1 of the subpixels 18R so as to cover the end parts of the green coloring layers 36G in the light emission suppression regions V2 at the boundary portions between the subpixels 18G and the subpixels 18R, and cover the end parts of the blue coloring layers 36B in the light emission suppression regions V2 at the boundary portions between the subpixels 18R and the subpixels 18B by coating with a photosensitive resist that includes a red color material (for example, a pigment) to form a photosensitive resin layer, exposing and developing the photosensitive resin layer using a photolithography method, and firing the product.

To explain in more detail, a red photosensitive resin layer is formed by coating with a photosensitive resist that includes a red color material using a spin-coating method, and drying the product. The red photosensitive resin layer is, for example, configured by a photosensitive acrylic resin, and a portion that is irradiated with light (exposed) is made insoluble. A region in which the red coloring layers 36R are formed is irradiated with light (exposed), and unexposed photosensitive resin layer is removed by discharging a developing fluid from nozzles, for example. Next, after washing photosensitive resin layer that was made insoluble by, for example, discharging pure water from nozzles, red coloring layers 36R of a predetermined shape are formed by firing and curing. A process temperature of the process of forming the green coloring layers 36R is less than or equal to 110° C.

In this manner, the process temperatures of the processes of forming the color filter layer 36 are less than or equal to 110° C., and thermal degradation of the light emission functional layer 32 is suppressed. Since the process temperatures are set to be less than or equal to 110° C., for example, moisture remains in the coloring layers 36B, 36G and 36R, and therefore, the adhesion of the coloring layers 36B, 36G and 36R with groundings films thereof is weaker than a case in which, for example, the coloring layers 36B, 36G and 36R are formed with a process temperature that is higher than 110° C. In other words, the bonding strength of the coloring layers 36B, 36G and 36R to the grounding films thereof is weaker.

Hereinafter, the adhesion of the coloring layers 36B, 36G and 36R to the grounding films thereof will be referred to as the adhesion of the coloring layers 36B, 36G and 36R, and the bonding strength of the coloring layers 36B, 36G and 36R to the grounding films thereof will be referred to as the bonding strength of the coloring layers 36B, 36G and 36R.

For example, since mechanical stress is applied to the photosensitive resin layers by discharging developing fluid and pure water from nozzles, if the adhesion of the photosensitive resin layers is too weak, there is a concern that the photosensitive resin layers will peel off from the grounding films thereof.

If a contact area of the grounding films and the coloring layers 36B, 36G and 36R is reduced, the bonding strength of the coloring layers 36B, 36G and 36R is weakened. Since the area of the coloring layers 36B, 36G and 36R becomes smaller in the order of the blue coloring layers 36B, the green coloring layers 36G and the red coloring layers 36R, the bonding strength of the coloring layers 36B, 36G and 36R becomes weaker in the order of the blue coloring layers 36B, the green coloring layers 36G and the red coloring layers 36R. That is, the bonding strength of the red coloring layers 36R is the weakest, and therefore, the most likely to peel away.

In addition to the light emission regions V1 of the subpixels 18R, the red coloring layers 36R are disposed in the light emission suppression regions V2 that are adjacent to the light emission regions V1 of the subpixels 18R. In other words, in addition to the subpixels 18R, the red coloring layers 36R are disposed in a part of the adjacent subpixels 18B and subpixels 18G. Accordingly, in the present embodiment, a layout area of the red coloring layers 36R (the contact area with the grounding film thereof) is larger than a case in which the red coloring layers 36R are disposed in the subpixels 18R only, and therefore, it is possible to obtain an effect of being able to enhance the bonding strength of the red coloring layers 36R.

The red coloring layers 36R are provided so as to cover the end parts of the green coloring layers 36G in the light emission suppression regions V2 at the boundary portions between the subpixels 18G and the subpixels 18R, and cover the end parts of the blue coloring layers 36B in the light emission suppression regions V2 at the boundary portions between the subpixels 18R and the subpixels 18B. In other words, the red coloring layers 36R include portions that come into contact with the coloring layers 36B and 36G, which are configured by materials of the same kind (an acrylic resin), in addition to portions that come into contact with the second sealing layer 34c, which is configured by a material of a different kind (a silicon oxynitride).

In portions that come into contact with materials of the same kind, the wettability and affinity (ease of attachment) of the red coloring layers 36R with the grounding film thereof are improved in comparison with the portions that come into contact with material of a different kind, and therefore the bonding strength of the coloring layers 36R is enhanced. Accordingly, in the present embodiment, by forming the red coloring layers 36R so as to cover the end parts of the blue coloring layers 36B and the green coloring layers 36G, it is possible to obtain an effect of being able to enhance the bonding strength of the red coloring layers 36R in comparison with a case in which the red coloring layers 36R are formed so as to cover the second sealing layer 34c only.

Furthermore, in the manufacturing method of the present embodiment, the coloring layer is formed in an order from the coloring layers with a larger area (formed in an order from the coloring layers in which the bonding strength is high). That is, the blue coloring layers 36B in which the area is largest (the bonding strength is highest) are formed first, the green coloring layers 36G in which the area is second largest (the bonding strength is second highest) are formed thereafter, and the red coloring layers 36R in which the area is smallest (the bonding strength is weakest) are formed last.

Assuming a case in which the red coloring layers 36R in which the area is smallest (the bonding strength is weakest) are formed first, there is a concern that, for example, the red coloring layers 36R will peel away due to the mechanical stress of the developing fluid and pure water being discharged from nozzles in manufacturing processes of the blue coloring layers 36B and the green coloring layers 36G that are formed thereafter. In the present embodiment, since the red coloring layers 36R in which the area is smallest (the bonding strength is weakest) are formed last, the red coloring layers 36R are not influenced by the effects of the manufacturing processes of the blue coloring layers 36B and the green coloring layers 36G.

Accordingly, even if the red coloring layers 36R in which the area is smallest (the bonding strength is weakest) are formed, it is possible to obtain an effect of being able to suppress defects (for example, peeling away) of the red coloring layers 36R that result from the bonding strength thereof being the weakest.

Therefore, defects of the red coloring layers 36R in which the bonding strength is weakest are suppressed, and therefore, it is possible to stably manufacture the organic EL device 100. Furthermore, in the organic EL device 100, faults that are caused by the red coloring layers 36R peeling away, for example, are suppressed, and it is possible to provide a high-definition display (a display that is flawless or in which there are few faults).

Embodiment 2

Figure 7:
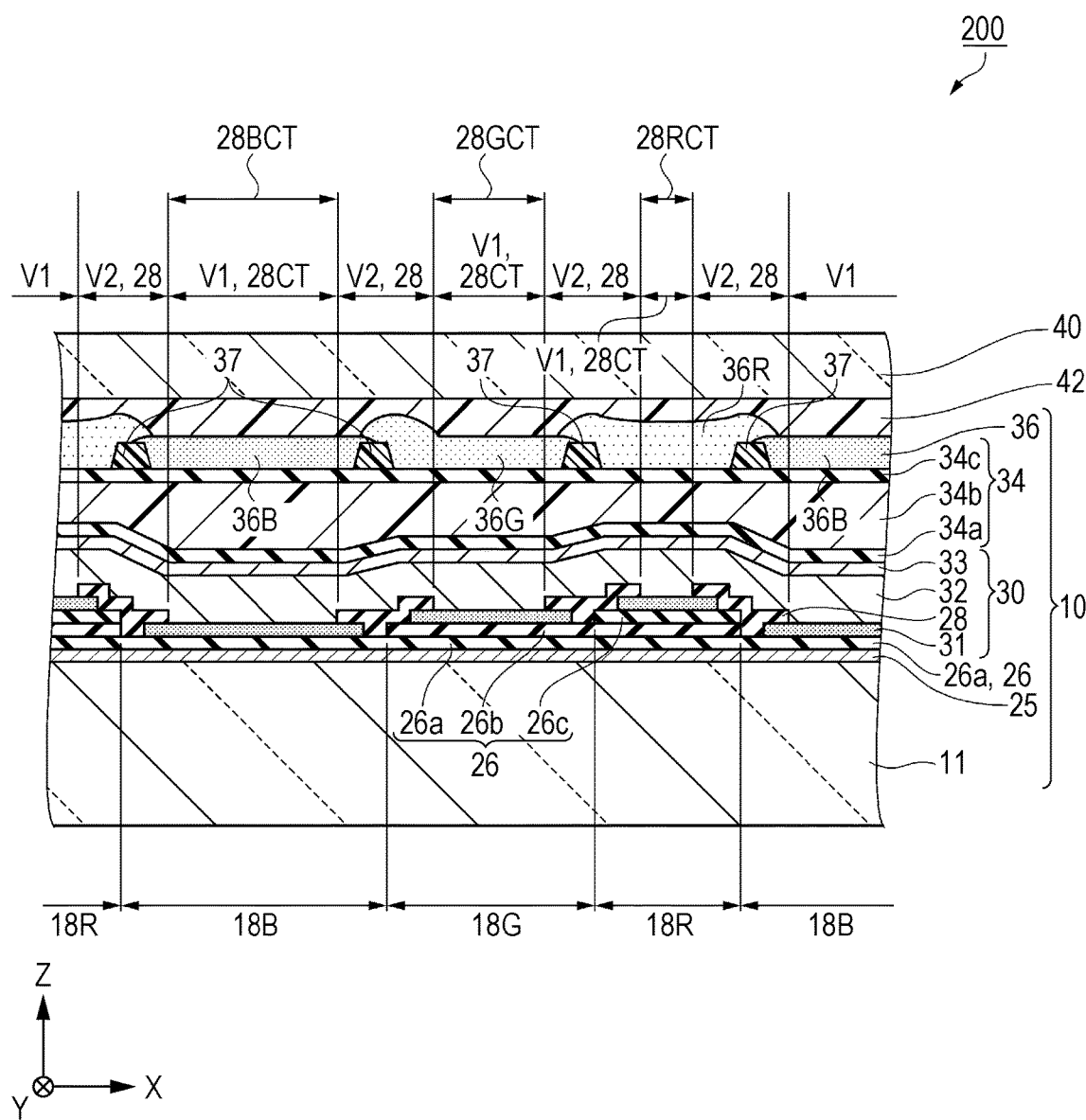
FIG. 7 is a schematic cross-sectional view that shows a summary of an organic EL device according to Embodiment 2.
Figure 8:
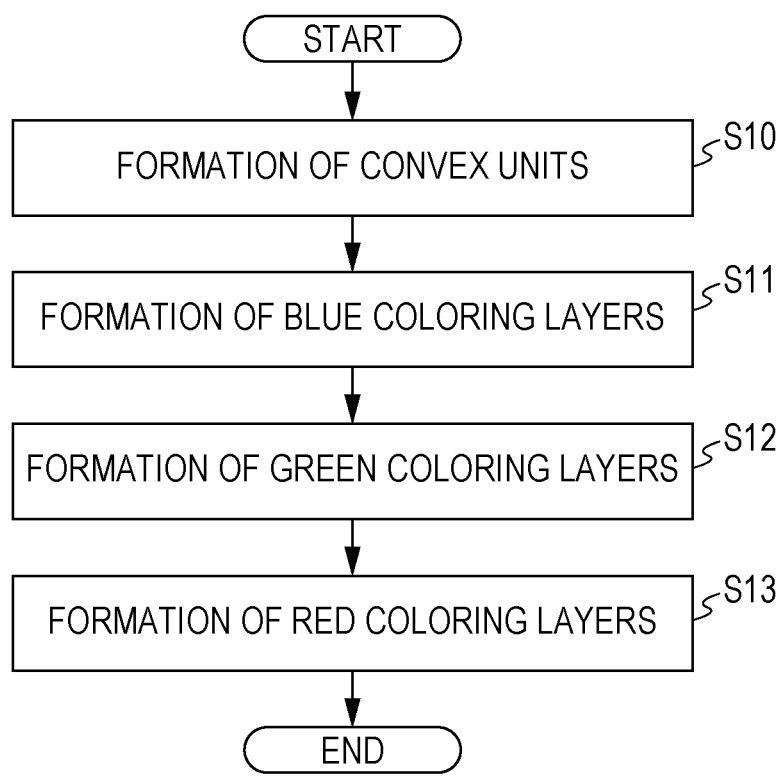
FIG. 8 is a process flow that shows a manufacturing method of a color filter layer.

FIG. 7 is a drawing that corresponds to FIG. 4, and is a schematic cross-sectional view that shows a summary of an organic EL device according to Embodiment 2. FIG. 8 is a process flow that shows a manufacturing method of a color filter layer. FIGS. 9A, 9B, 9C and 9D are drawings that correspond to FIG. 7, and are schematic cross-sectional views that show states after passing each process of the process flow that is shown in FIG. 8.

In an organic EL device 200 of the present embodiment, convex units 37 are provided between the second sealing layer 34c and the color filter layer 36. This feature is the main point of difference between the organic EL device 200 of the present embodiment and the organic EL device 100 of Embodiment 1.

Hereinafter, a summary of the organic EL device 200 according to the present embodiment will be described focusing on the points of difference with Embodiment 1 with reference to FIGS. 7 to 9D. Additionally, constituent elements that are the same as Embodiment 1 are given the same symbols, and overlapping description thereof has been omitted.

As shown in FIG. 7, the convex units 37 are configured by the same main material (an acrylic resin that does not include a color material) as the coloring layers 36B, 36G and 36R, and are disposed in the light emission suppression regions V2 between the sealing layer 34 (the second sealing layer 34c) and the color filter layer 36. In other words, the convex units 37 are disposed in portions in which the blue coloring layers 36B and the green coloring layers 36G are adjacent, portions in which the green coloring layers 36G and the red coloring layers 36R are adjacent, and portions in which the red coloring layers 36R and the blue coloring layers 36B are adjacent.

Furthermore, the coloring layers 36B, 36G and 36R are disposed so as to cover a portion of the convex units 37.

The convex units 37 are an example of a "transparent layer" in the present embodiment.

The blue coloring layers 36B are disposed so as to cover between the convex units 37 that are disposed in the light emission suppression regions V2 at the boundary portions between the subpixels 18B and the subpixels 18R, and the convex units 37 that are disposed in the light emission suppression regions V2 at the boundary portions between the subpixels 18B and the subpixels 18G, and come into contact with side wall parts and top wall parts of the convex units 37.

The green coloring layers 36G are disposed so as to cover between the convex units 37 that are disposed in the light emission suppression regions V2 at the boundary portions between the subpixels 18G and the subpixels 18B, and the convex units 37 that are disposed in the light emission suppression regions V2 at the boundary portions between the subpixels 18G and the subpixels 18R, and come into contact with side wall parts and top wall parts of the convex units 37. Furthermore, the green coloring layers 36G cover the end parts of the blue coloring layers 36B in the light emission suppression regions V2 at the boundary portions between the subpixels 18G and the subpixels 18B.

The red coloring layers 36R are disposed so as to cover between the convex units 37 that are disposed in the light emission suppression regions V2 at the boundary portions between the subpixels 18R and the subpixels 18B, and the convex units 37 that are disposed in the light emission suppression regions V2 at the boundary portions between the subpixels 18R and the subpixels 18G, and come into contact with side wall parts and top wall parts of the convex units 37. Furthermore, the red coloring layers 36R cover the end parts of the blue coloring layers 36B in the light emission suppression regions V2 at the boundary portions between the subpixels 18R and the subpixels 18B, and cover the end parts of the green coloring layers 36G in the light emission suppression regions V2 at the boundary portions between the subpixels 18R and the subpixels 18G.

As shown in FIG. 8, the manufacturing method of the color filter layer 36 includes a process of forming the convex units 37 (Step S10), a process of forming the blue coloring layers 36B (Step S11), a process of forming the green coloring layers 36G (Step S12), and a process of forming the red coloring layers 36R (Step S13).

Step S11 of the present embodiment is the same as Step S1 of Embodiment 1 (FIG. 5), Step S12 of the present embodiment is the same as Step S2 of Embodiment 1 (FIG. 5), and Step S13 of the present embodiment is the same as Step S3 of Embodiment 1 (FIG. 5).

Figure 9A:
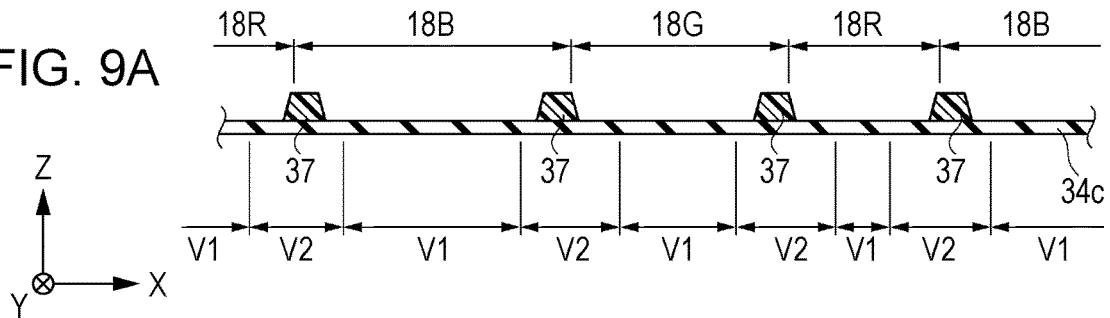
FIGS. 9A, 9B, 9C and 9D are schematic cross-sectional views that show states after passing each process of the process flow that is shown in FIG. 8.

As shown in FIG. 9A, the convex units 37 are formed in the light emission suppression regions V2 by coating with a transparent photosensitive resist, or in more detail, a translucent photosensitive resist, the hue of which is tinged, and which includes a sensitizer or the like, exposing and developing the photosensitive resist using a photolithography method, and firing the product.

To explain in more detail, a transparent photosensitive resin layer is formed by coating with a transparent photosensitive resist using a spin-coating method, and drying the product. The transparent photosensitive resin layer is, for example, configured by a photosensitive acrylic resin, and a portion that is irradiated with light (exposed) is made insoluble. The transparent photosensitive resin layer is configured by the same material as the photosensitive resin layers that are used in the processes of forming the coloring layers 36B, 36G and 36R. A region in which the convex units 37 are formed is irradiated with light (exposed), and unexposed photosensitive resin layer is removed by discharging a developing fluid from nozzles, for example. Next, after washing photosensitive resin layer that was made insoluble by, for example, discharging pure water from nozzles, convex units 37 of a predetermined shape are formed in the light emission suppression regions V2 by firing and curing. Additionally, the photosensitive resin layer becomes a transparent resin layer by the transparency thereof being increased through irradiation with light (exposure). A process temperature of the process of forming the convex units 37 is less than or equal to 110° C.

Regions in which the blue coloring layers 36B are formed are partitioned by the convex units 37 that are disposed in the light emission suppression regions V2 at the boundary portions between the subpixels 18B and the subpixels 18R, and the convex units 37 that are disposed in the light emission suppression regions V2 at the boundary portions between the subpixels 18B and the subpixels 18G, and cells (concave units) that are to be filled with the photosensitive resist that includes a blue color material that is used in a subsequent process, are formed.

Regions in which the green coloring layers 36G are formed are partitioned by the convex units 37 that are disposed in the light emission suppression regions V2 at the boundary portions between the subpixels 18G and the subpixels 18B, and the convex units 37 that are disposed in the light emission suppression regions V2 at the boundary portions between the subpixels 18G and the subpixels 18R, and cells (concave units) that are to be filled with the photosensitive resist that includes a green color material that is used in a subsequent process, are formed.

Regions in which the red coloring layers 36R are formed are partitioned by the convex units 37 that are disposed in the light emission suppression regions V2 at the boundary portions between the subpixels 18R and the subpixels 18B, and the convex units 37 that are disposed in the light emission suppression regions V2 at the boundary portions between the subpixels 18R and the subpixels 18G, and cells (concave units) that are to be filled with the photosensitive resist that includes a red color material that is used in a subsequent process, are formed.

Figure 9B:
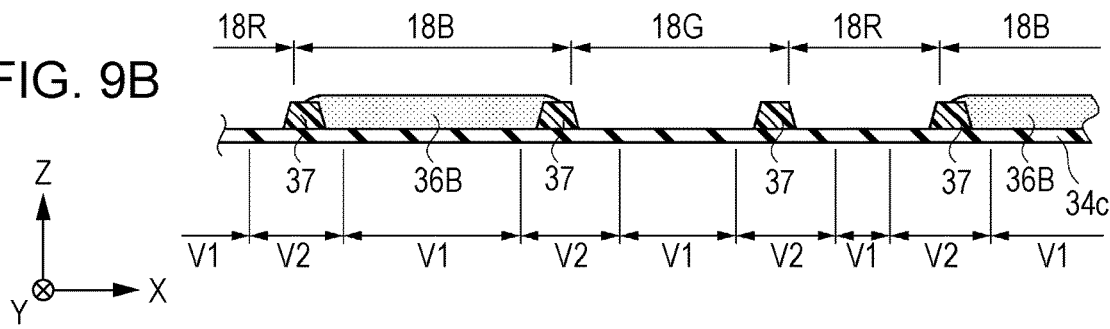

As shown in FIG. 9B, the blue coloring layers 36B are formed so as to come into contact with the second sealing layer 34c, and the side wall parts and top wall parts of the convex units 37 by filling the inside of cells that are formed by the convex units 37 with a photosensitive resist that includes a blue color material to form a blue photosensitive resin layer, exposing and developing the photosensitive resin layer using a photolithography method, and firing the product.

Figure 9C:
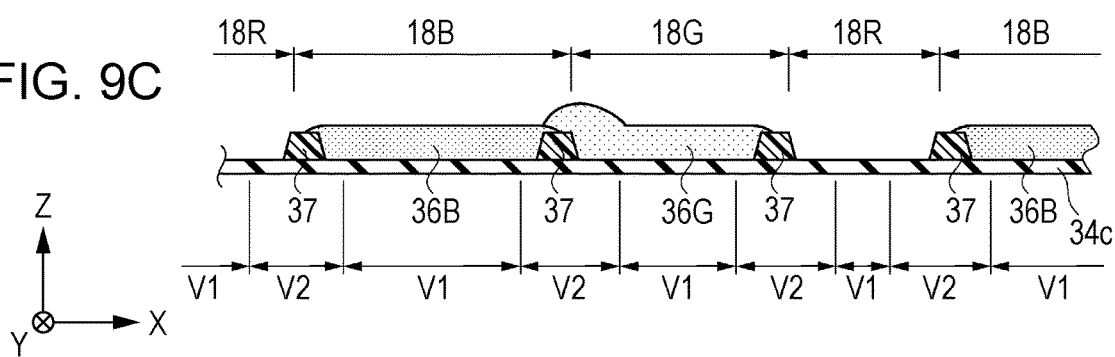

As shown in FIG. 9C, the green coloring layers 36G are formed so as to come into contact with the second sealing layer 34c, and the side wall parts and top wall parts of the convex units 37 by filling the inside of cells that are formed by the convex units 37 with a photosensitive resist that includes a green color material to form a green photosensitive resin layer, exposing and developing the photosensitive resin layer using a photolithography method, and firing the product.

Figure 9D:
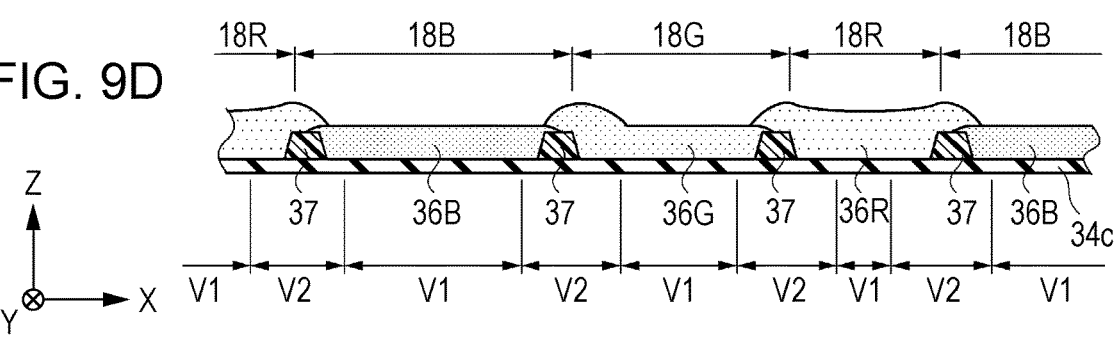

As shown in FIG. 9D, the red coloring layers 36R are formed so as to come into contact with the second sealing layer 34c, and the side wall parts and top wall parts of the convex units 37 by filling the inside of cells that are formed by the convex units 37 with a photosensitive resist that includes a red color material to form a red photosensitive resin layer, exposing and developing the photosensitive resin layer using a photolithography method, and firing the product.

In the present embodiment, in addition to the effects that are obtained by Embodiment 1, it is possible to obtain the following effects.

1) Since the cells that are formed by the convex units 37 are filled with the photosensitive resists that form the coloring layers 36B, 36G and 36R, it is possible to improve the uniformity of film thickness of the photosensitive resists that form the coloring layers 36B, 36G and 36R.

2) Since the color materials (for example, pigments) are not dispersed in the convex units 37, it is possible to enhance the bonding strength of the convex units 37 in comparison with the coloring layers 36B, 36G and 36R in which the color materials are dispersed.

3) By forming the coloring layers 36B, 36G and 36R so as to come into contact with the side wall parts and top wall parts of the convex units 37, the bonding strength of which is high, that is, so as to come into contact with the convex units 37, which are materials of the same kind, it is possible to enhance the bonding strength of the coloring layers 36B, 36G and 36R.

4) Due to the convex units 37, it is possible to suppress a circumstance in which the photosensitive resist that forms the green coloring layers 36G in Step S12, for example, flows onto a side of the blue coloring layers 36B or the like, and the photosensitive resist that forms the green coloring layers 36R in Step S13, flows onto a side of the blue coloring layers 36B or the green coloring layers 36G. That is, due to the convex units 37, it is possible to suppress mixed colors of the color materials.

Embodiment 3

Electronic Apparatus

Figure 10:
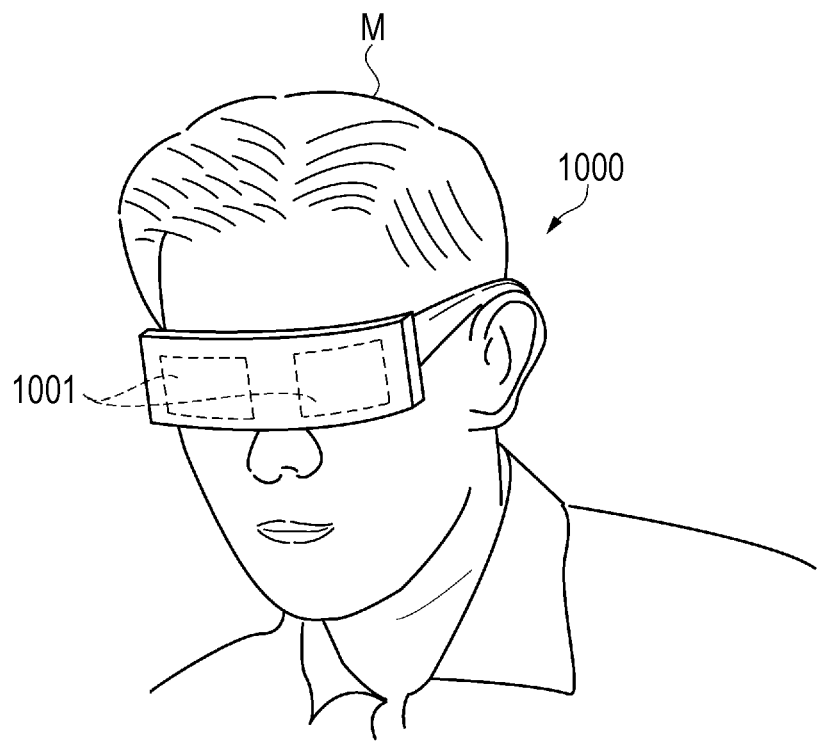
FIG. 10 is a schematic view of a head-mounted display according to Embodiment 3.

FIG. 10 is a schematic view of a head-mounted display as an example of an electronic apparatus.

As shown in FIG. 10, a head-mounted display 1000 includes two display units 1001 which are provided to correspond to the left and right eyes. By mounting the head-mounted display 1000 on a head part in a manner similar to glasses, it is possible for an observer M to view characters, images and the like which are displayed on the display units 1001. For example, if an image in which a parallax in the left and right display units 1001 is taken into account is displayed, it is possible for the observer M to enjoy a stereoscopic image.

The display units 1001 are equipped with either the organic EL device 100 or the organic EL device 200 according to the abovementioned embodiments. In the abovementioned embodiments, a defect of the red coloring layers 36R, the bonding strength of which is weakest, peeling away is suppressed, and it is possible to stably manufacture an organic EL device 100 or an organic EL device 200 that provides a high definition display. Therefore, by equipping the display units 1001 with either the organic EL device 100 or the organic EL device 200 according to the abovementioned embodiments, it is possible to stably provide a head-mounted display 1000 with a high definition display.

Additionally, the electronic apparatus in which either the organic EL device 100 or the organic EL device 200 according to the abovementioned embodiments is equipped is not limited to the head-mounted display 1000. For example, the organic EL device 100 or the organic EL device 200 according to the abovementioned embodiments may be equipped in an electronic apparatus that includes a display unit of a heads-up display, an electronic viewfinder of a digital camera, a portable information terminal, a navigator or the like.

The present invention is not limited to the abovementioned embodiments, and may be changed as appropriate within a range that is not contrary to the fundamentals or idea of the invention that can be understood from the claims and the specification as a whole. Organic light emitting devices that accompany such changes and electronic apparatuses that are equipped with said organic light emitting devices are also included within the technical scope of the present invention.

It is possible to think of various modification examples other than the abovementioned embodiments. Hereinafter, modification examples are described as examples.

Modification Example 1

Figure 11:
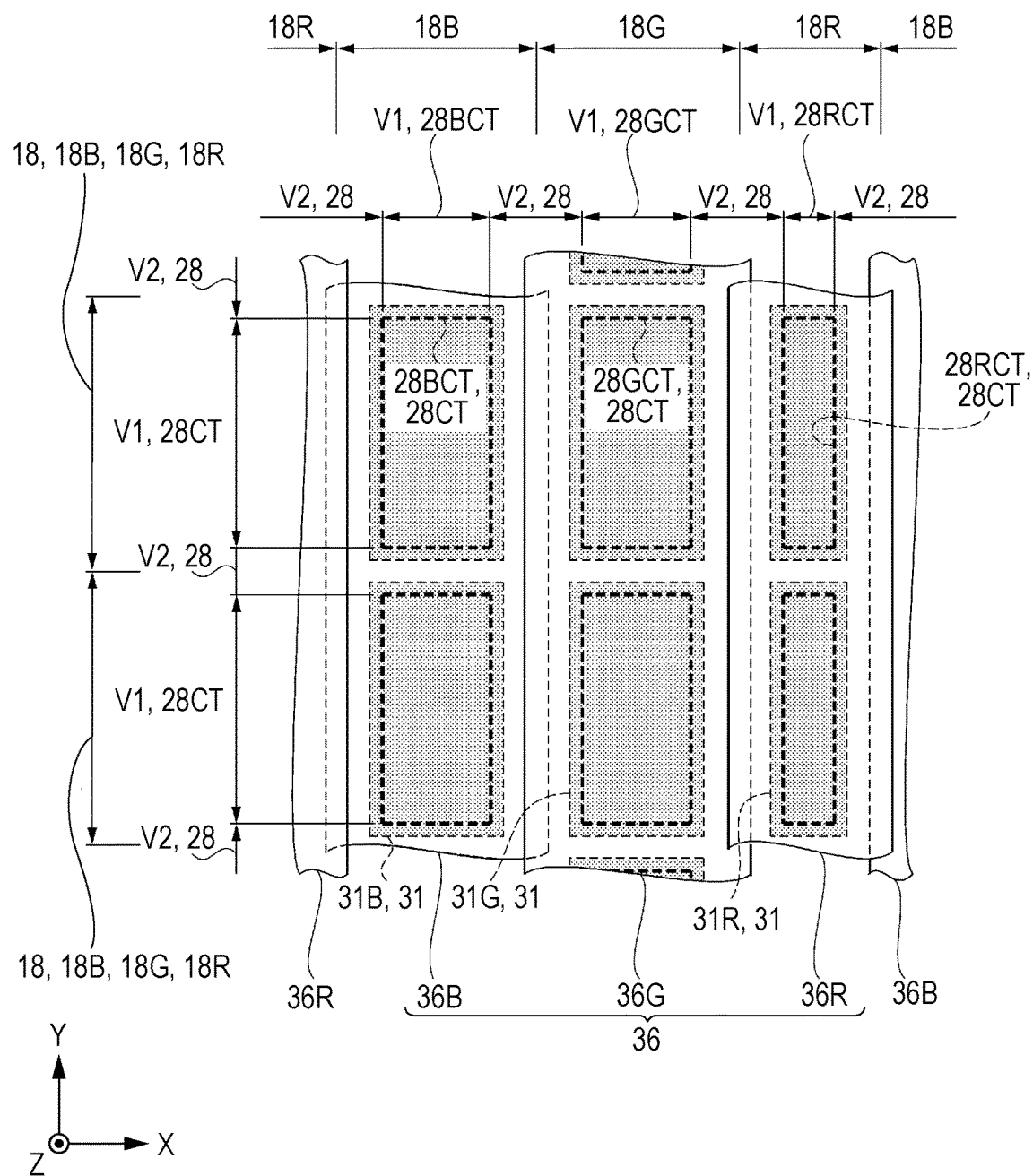
FIG. 11 is a schematic plan view that shows a configuration of subpixels of an organic EL device according to Modification Example 1.

FIG. 11 is a schematic plan view that shows a configuration of subpixels of an organic EL device according to Modification Example 1. In the present modification example, the areas of the subpixels 18B, 18G and 18R differ from those of Embodiment 1.

As shown in FIG. 11, the length of the subpixels 18B in the X direction and the length of the subpixels 18G in the X direction are the same, and the length of the subpixels 18R in the X direction is smaller than the length of the subpixels 18B in the X direction and the length of the subpixels 18G in the X direction. The length of the subpixels 18B in the Y direction, the length of the subpixels 18G in the Y direction and the length of the subpixels 18R in the Y direction are respectively the same. Therefore, the area of the subpixels 18B and the area of the subpixels 18G are the same, and the area of the subpixels 18R is smaller than the area of the subpixels 18B and the area of the subpixels 18G.

Furthermore, the area of a portion in which the openings 28BCT are provided is the same as the area of a portion in which the openings 28GCT are provided, and the area of a portion in which the openings 28RCT are provided is smaller than the area of a portion in which the openings 28BCT are provided and the area of a portion in which the openings 28GCT are provided. That is, the area of the light emission regions V1 of the subpixels 18B and the area of the light emission regions V1 of the subpixels 18G are the same, and the area of the light emission regions V1 of the subpixels 18R is smaller than the area of the light emission regions V1 of the subpixels 18B and the area of the light emission regions V1 of the subpixels 18G.

Furthermore, the area of the blue coloring layers 36B is the same as the area of the green coloring layers 36G, and the area of the red coloring layers 36R is smaller than the area of the blue coloring layers 36B and the area of the green coloring layers 36G. Accordingly, the bonding strength of the red coloring layers 36R is the weakest.

Since the red coloring layers 36R have the same configuration as that of Embodiment 1, it is possible to obtain the same effects as Embodiment 1, or in other words, to make peeling of the red coloring layers 36R, the bonding strength of which is weakest, difficult. Therefore, in the present modification example, defects such as the coloring layers of portions in which the bonding strength is weakest (the red coloring layers 36R) peeling away are also suppressed, and it is also possible to stably manufacture an organic EL device that provides a high-definition display (a display that is flawless or in which there are few faults).

Modification Example 2

Figure 12:
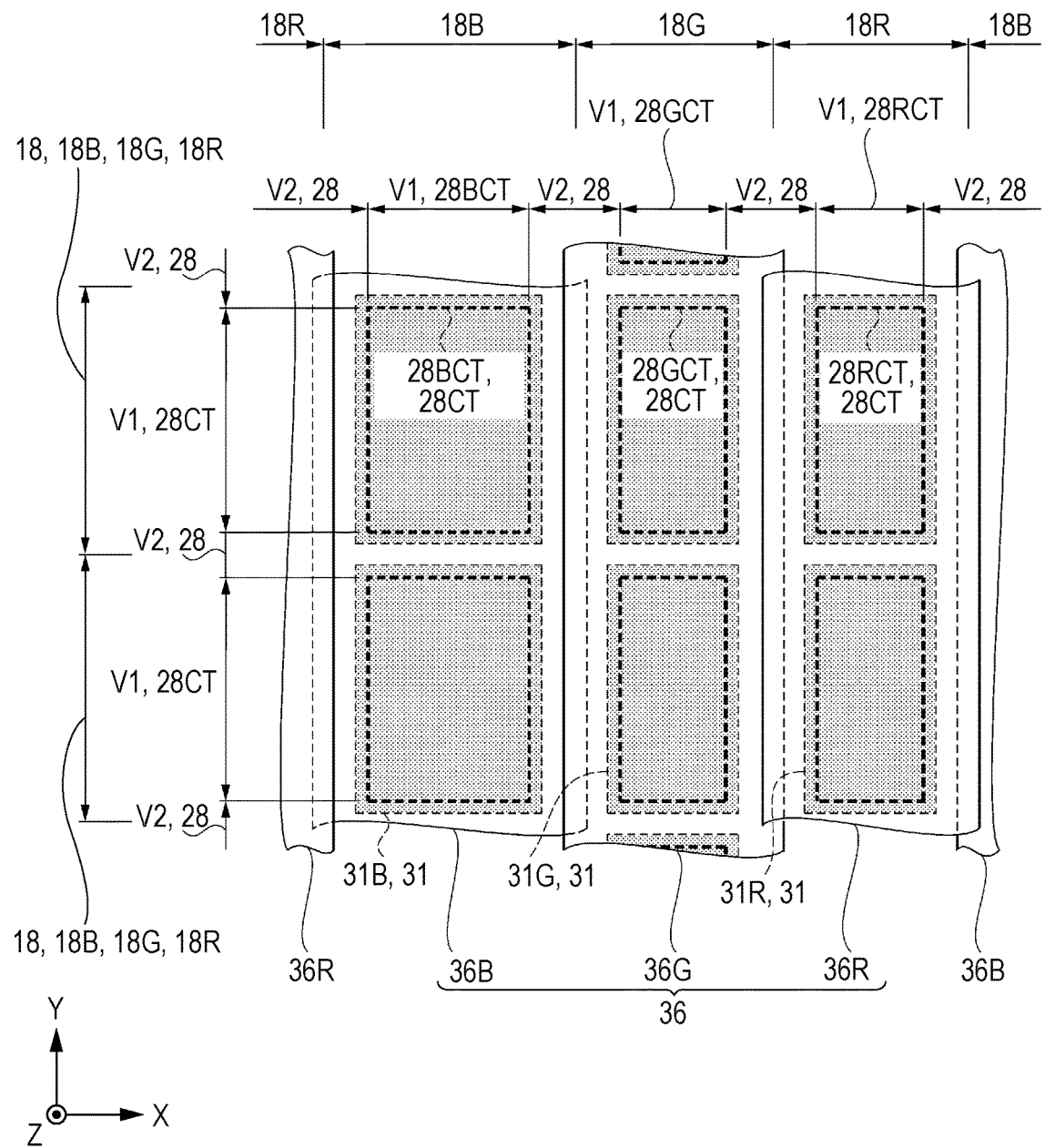
FIG. 12 is a schematic plan view that shows a configuration of subpixels of an organic EL device according to Modification Example 2.

FIG. 12 is a schematic plan view that shows a configuration of subpixels of an organic EL device according to Modification Example 2. In the present modification example, the areas of the subpixels 18B, 18G and 18R differ from those of Embodiment 1.

As shown in FIG. 12, the length of the subpixels 18B in the X direction is larger than the length of the subpixels 18G in the X direction and the length of the subpixels 18R in the X direction, and the length of the subpixels 18G in the X direction is the same as the length of the subpixels 18R in the X direction. The length of the subpixels 18B in the Y direction, the length of the subpixels 18G in the Y direction and the length of the subpixels 18R in the Y direction are respectively the same. Therefore, the area of the subpixels 18B is larger than the area of the subpixels 18G and the area of the subpixels 18R, and the area of the subpixels 18G is the same as the area of the subpixels 18R.

Furthermore, the area of a portion in which the openings 28BCT are provided is larger than the area of a portion in which the openings 28GCT are provided and the area of a portion in which the openings 28RCT are provided, and the area of a portion in which the openings 28GCT are provided is the same as the area of a portion in which the openings 28RCT are provided. That is, the area of the light emission regions V1 of the subpixels 18B is larger than the area of the light emission regions V1 of the subpixels 18G and the area of the light emission regions V1 of the subpixels 18R, and the area of the light emission regions V1 of the subpixels 18G is the same as the area of the light emission regions V1 of the subpixels 18R.

Furthermore, the area of the blue coloring layers 36B is larger than the area of the green coloring layers 36G and the area of the red coloring layers 36R, and the area of the green coloring layers 36G is the same as the area of the red coloring layers 36R. Accordingly, the bonding strengths of the green coloring layers 36G and the red coloring layers 36R is weaker than the bonding strength of the blue coloring layers 36B.

Since the red coloring layers 36R have the same configuration as that of Embodiment 1, it is possible to obtain the same effects as Embodiment 1, or in other words, to make peeling of the red coloring layers 36R, the bonding strength of which is weakest, difficult.

The green coloring layers 36G include portions that come into contact with materials of the same kind (the blue coloring layers 36B (acrylic resin)), in addition to portions that come into contact with a material of a different kind (the second sealing layer 34c (a silicon oxynitride)), and the bonding strength of the green coloring layers 36G is enhanced by providing portions that come into contact with materials of the same kind. Therefore, it is also possible to make peeling of the green coloring layers 36G, the bonding strength of which is weak, difficult in the same manner as the red coloring layers 36R.

Therefore, in the present modification example, even if the coloring layers in which the bonding strength is weak (the green coloring layers 36G and the red coloring layers 36R) are formed, defects such as peeling away the coloring layers in which the bonding strength is weak (the green coloring layers 36G and the red coloring layers 36R) are also suppressed, and it is possible to stably manufacture an organic EL device that provides a high-definition display (a display that is flawless or in which there are few faults).

Modification Example 3

The coloring layer in which the area is smallest is not limited to the red coloring layers 36R, and for example, may be the green coloring layers 36G. In other words, the coloring layer may have a configuration in which the area of blue coloring layers 36B is the largest (the bonding strength is highest), the area of the red coloring layers 36R is the second largest (the bonding strength is second highest), and the area of the green coloring layers 36G is the smallest (the bonding strength is weakest).

In this case, it is also important to form in order from the coloring layer with the largest area (the coloring layer in which the bonding strength is highest). That is, it is important to form the blue coloring layers 36B in which the area is largest first, form the red coloring layers 36R in which the area is second largest thereafter, and form the green coloring layers 36G in which the area is smallest last.

Furthermore, it is preferable that the green coloring layers 36G in which the area is smallest be formed so as to cover the end parts of the blue coloring layers 36B, the area of which is largest, and the end parts of the red coloring layers 36R, the area of which is second largest, and the red coloring layers 36R, the area of which is second largest be formed so as to cover the end parts of the blue coloring layers 36B, the area of which is largest.

Modification Example 4

In the abovementioned embodiments and the abovementioned modification examples, a configuration in which the lengths of the subpixels 18 in the Y direction are respectively the same for the subpixels 18B, the subpixels 18G and the subpixels 18R, is used, but the lengths may be different, and it is suitable as long as at least a relationship between the areas of the subpixels 18 is as described above.

Modification Example 5

In the abovementioned embodiments and the abovementioned modification examples, the areas of the pixel electrode 31 were set to be different, but the areas of the pixel electrode 31B, the pixel electrode 31G and the pixel electrode 31R may be the same. It is suitable as long as a relationship between the area of portions in which the openings 28BCT are provided, the area of portions in which the openings 28GCT are provided and the area of portions in which the openings 28RCT are provided is as described above.

What is claimed is:
1. A method of manufacturing an organic light emitting device comprising, in the following order:
  forming an organic light emitting layer on a substrate so as to form a first light emitting element, a second light emitting element, and a third light emitting element, a light emission area of the second light emitting element being smaller than a light emission area of the third light emitting element, the light emission area of the third light emitting element being smaller than a light emission area of the first light emitting element;
  forming a sealing layer on the organic light emitting layer;
  forming a color filter layer on the sealing layer in the following order, including:

forming a first color filter that filters light from the first light emitting element and transmits light of a first wavelength region;

forming a third color filter that filters light from the third light emitting element, transmits light of a third wavelength region, and is smaller in area than the first color filter; and forming a second color filter that filters light from the second light emitting element, transmits light of a second wavelength region, and is smaller in area than the third color filter; and attaching a protective substrate to the color filter layer using a resin layer, wherein the second color filter is a red color filter.

2. The method of manufacturing according to claim 1, wherein the organic light emitting device further includes an insulating film that suppresses emission of light of the organic light emitting layer, and the method further comprises:

forming a transparent layer between the sealing layer and the color filter layer in a portion that overlaps with the insulating film in a plan view before the forming of the first color filter.

3. The method of manufacturing according to claim 1, wherein no process temperature of forming the color filter layer exceeds 110° C.

4. The method of manufacturing according to claim 1, wherein
the first color filter, the second color filter and the third color filter are formed in a striped form.

5. The method of manufacturing according to claim 1, wherein
the first color filter, the second color filter and the third color filter are formed by spin-coating the sealing layer.

6. The method of manufacturing according to claim 1, wherein
the first color filter is a blue color filter.

7. The method of manufacturing according to claim 6, wherein
the third color filter is a green color filter.

8. A method of manufacturing an organic light emitting device, the method comprising, in the following order:

forming an organic light emitting layer on a substrate, the organic light emitting layer including:
a first light emitting element;
a second light emitting element; and
a third light emitting element;

forming a sealing layer on the organic light emitting layer;

forming a color filter layer on the sealing layer in the following order, including:

forming a first color filter that filters light from the first light emitting element and that transmits light of a first wavelength region;

forming a third color filter that filters light from the third light emitting element and that transmits light of a third wavelength region, the third color filter being smaller in area than the first color filter; and forming a second color filter that filters light from the second light emitting element and that transmits light of a second wavelength region, the second color filter being smaller in area than the third color filter; and attaching a protective substrate to the color filter layer using a resin layer, wherein the second color filter is a red color filter.

9. The method of manufacturing according to claim 8, wherein the organic light emitting device further includes an insulating film that suppresses emission of light of the organic light emitting layer, and the method further comprises:

forming a transparent layer between the sealing layer and the color filter layer in a portion that overlaps with the insulating film in a plan view before the forming of the first color filter.

10. The method of manufacturing according to claim 8, wherein
the first color filter, the second color filter and the third color filter are formed in a striped form.

11. The method of manufacturing according to claim 8, wherein
the first color filter, the second color filter and the third color filter are formed by spin-coating the sealing layer.

12. The method of manufacturing according to claim 8, wherein
the first color filter is a blue color filter.

13. The method of manufacturing according to claim 12, wherein
the third color filter is a green color filter.

14. A manufacturing method of an organic light emitting device, the method comprising, in the following order:

forming an organic light emitting layer on a substrate, the organic light emitting layer including:
a first light emitting element;
a second light emitting element; and
a third light emitting element;

forming a sealing layer on the organic light emitting layer;

forming a color filter layer on the sealing layer in the following order, including:

forming a first color filter that filters light from the first light emitting element and that transmits light of a first wavelength region;

forming a third color filter that filters light from the third light emitting element and that transits light of a third light wavelength region; and forming a second color filter that filters light from the second light emitting element and that transmits light of a second wavelength region; and attaching a protective substrate to the color filter layer using a resin layer, wherein a light emission area of the second light emitting element is smaller than a light emission area of the third light emitting element, the light emission area of the third light emitting element is smaller than a light emission area of the first light emitting element, and the second color filter is a red color filter.

15. The method of manufacturing according to claim 14, wherein the organic light emitting device further includes an insulating film that suppresses emission of light of the organic light emitting layer, and the method further comprises:

forming a transparent layer between the sealing layer and the color filter layer in a portion that overlaps with the insulating film in a plan view before the forming of the first color filter.

16. The method of manufacturing according to claim 14, wherein
the first color filter, the second color filter and the third color filter are formed in a striped form.

17. The method of manufacturing according to claim 14, wherein
the first color filter, the second color filter and the third color filter are formed by spin-coating the sealing layer.

18. The method of manufacturing according to claim 14, wherein
the first color filter is a blue color filter.

19. The method of manufacturing according to claim 18, wherein
the third color filter is a green color filter.

* * * * *